United States Patent
Tang et al.

(10) Patent No.: US 11,709,424 B2
(45) Date of Patent: Jul. 25, 2023

(54) MASK, DISPLAY PANEL, AND ELECTRONIC EQUIPMENT

(71) Applicant: Shenzhen China Star Optoelectronics Semiconductor Display Technology Co., Ltd., Shenzhen (CN)

(72) Inventors: Yanzong Tang, Shenzhen (CN); Juncheng Xiao, Shenzhen (CN); Bin Zhao, Shenzhen (CN); Xin Zhang, Shenzhen (CN); Jun Zhao, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/972,595

(22) PCT Filed: Sep. 4, 2020

(86) PCT No.: PCT/CN2020/113573
§ 371 (c)(1),
(2) Date: Dec. 6, 2020

(87) PCT Pub. No.: WO2021/189776
PCT Pub. Date: Sep. 30, 2021

(65) Prior Publication Data
US 2023/0004080 A1 Jan. 5, 2023

(30) Foreign Application Priority Data
Mar. 22, 2020 (CN) .......................... 202010204815.7

(51) Int. Cl.
*G03F 7/00* (2006.01)
*G02F 1/1362* (2006.01)
(Continued)

(52) U.S. Cl.
CPC ...... *G03F 7/0007* (2013.01); *G02F 1/133512* (2013.01); *G02F 1/133516* (2013.01); *G02F 1/136295* (2021.01); *H01L 27/124* (2013.01)

(58) Field of Classification Search
CPC ............ G02F 1/133514; G02F 1/1303; G02F 1/133516; G02F 1/133512;
(Continued)

(56) References Cited

U.S. PATENT DOCUMENTS 10,921,652 B2 * 2/2021 Park ..................... G02F 1/13439
10,950,636 B2 * 3/2021 Huang .............. G02F 1/133345
(Continued)

FOREIGN PATENT DOCUMENTS

CN        103225059 A     7/2013
CN        104423084 A     3/2015
(Continued)

*Primary Examiner* — Vinh T Lam
(74) *Attorney, Agent, or Firm* — Nathan & Associates; Menachem Nathan

(57) ABSTRACT

A mask, a display panel, and an electronic equipment are provided. The mask allows an opening pattern to be moved to a side of a repeat region. Based on this structure, the display panels with the same resolution and different sizes may use the masks with the same size, and differences between these masks are merely different distances between the opening patterns and edges of the repeat regions, thus solving at least one technical problem existing in conventional 8K electronic equipment that the masks with the different sizes require to be manufactured for the display panels with the different sizes.

20 Claims, 15 Drawing Sheets

(51) Int. Cl.
*G02F 1/1335* (2006.01)
*H01L 27/12* (2006.01)

(58) Field of Classification Search
CPC ............. G02F 1/136295; G03F 7/0007; H01L 27/124; G09G 2310/0286; G09G 3/3266
See application file for complete search history.

(56) References Cited

U.S. PATENT DOCUMENTS

| | | | |
|---|---|---|---|
| 10,991,731 B2* | 4/2021 | Kasahara | ............ H01L 27/1225 |
| 11,163,189 B2* | 11/2021 | Mibu | ................. G02F 1/133512 |
| 2022/0122554 A1* | 4/2022 | Liao | ................. G02F 1/136209 |

FOREIGN PATENT DOCUMENTS

| | | | | |
|---|---|---|---|---|
| CN | 109407459 A | * | 3/2019 | ........... G02F 1/1303 |
| CN | 110658645 A | * | 1/2020 | |
| CN | 111090190 A | | 5/2020 | |
| CN | 111090195 A | | 5/2020 | |
| CN | 111091775 A | | 5/2020 | |
| JP | 2000054168 A | | 2/2000 | |
| KR | 20060029365 A | | 4/2006 | |

* cited by examiner

US 11,709,424 B2

MASK, DISPLAY PANEL, AND ELECTRONIC EQUIPMENT

FIELD OF INVENTION

The present disclosure relates to the field of display, and in particular, to a mask, a display panel, and an electronic equipment.

BACKGROUND OF INVENTION

With development of display technology, resolution of electronic equipment, such as display screens, televisions, mobile phones, and the like, is gradually increased. The increasing of the resolution corresponds to increasing of numbers of pixels; however, the increasing of the numbers of the pixels brings a variety of technical problems that require to be overcome.

For example, an area of a single sub-pixel of the electronic equipment with 8K resolution is a quarter of an area of a single sub-pixel of the electronic equipment with 4K resolution, which is accompanied by difficulty in manufacturing the corresponding mask and increased costs. In the manufacturing processes of actual products, due to the single sub-pixel with the different areas, the masks with different sizes requires to be developed and manufactured for the display panel with the same resolution and different sizes. For example, when the 65-inch display panel with the 8K resolution and the 85-inch display panel with the 8K resolution are manufactured, the masks with the different sizes require to be used, thus causing high development costs. In this case, the size of the mask refers to a size of a shading zone on the mask.

Therefore, the conventional 8K electronic equipment at least has a technical problem that the masks with the different sizes require to be manufactured for the display panels with the different sizes, which requires to be improved.

SUMMARY OF INVENTION

Technical Problem

A mask, a display panel, and an electronic equipment are provided to solve at least one technical problem existing in conventional 8K electronic equipment that masks with different sizes require to be manufactured for display panels with different sizes.

Technical Solutions

In order to solve the above-mentioned problem, the present disclosure provides technical solutions as follows.

The present disclosure provides a mask for manufacturing a color filter substrate, and the mask includes:

a mask substrate; and an opening pattern formed on the mask substrate;

wherein the mask includes a plurality of repeat regions, and the repeat region includes a first region corresponding to the opening pattern and a second region surrounding the first region; the second region includes a first side region and a second side region which are arranged in a row direction and parallel to each other as well as a third side region and a fourth side region which are arranged in a column direction and parallel to each other; and a first distance from a side of the first side region away from the opening pattern to the opening pattern is less than a second distance from a side of the second side region away from the opening pattern to the opening pattern.

In the mask of the present disclosure, a third distance from a side of the third side region away from the opening pattern to the opening pattern is equal to a fourth distance from a side of the fourth side region away from the opening pattern to the opening pattern.

In the mask of the present disclosure, the first distance is less than 12 μm, and the second distance is greater than 32 μm.

In the mask of the present disclosure, the first distance is less than 10 μm, and the second distance is greater than 34 μm.

In the mask of the present disclosure, a width of the opening pattern in the row direction is 28 μm.

In the mask of the present disclosure, a sum of the first distance and the second distance is 44 μm.

The present disclosure further provides a display panel including a color filter substrate and an array substrate that are oppositely disposed, and the color filter substrate includes:

a base substrate;

a plurality of black matrices formed on the base substrate and including openings for filling with color filter layers; and a plurality of color filter layers formed within the openings;

wherein the color filter substrate includes a plurality of pixel regions arranged in an array and corresponding to sub-pixels; the pixel region includes a first region corresponding to the opening as well as a second region surrounding the first region, and the black matrix is formed on the second region; the second region includes a first side region and a second side region which are arranged in a row direction and parallel to each other as well as a third side region and a fourth side region which are arranged in a column direction and parallel to each other; and a fifth distance from a side of the first side region away from the opening to the opening is less than a sixth distance from a side of the second side region away from the opening to the opening.

In the display panel of the present disclosure, in the row direction, the fifth distance is less than 18 μm, and the sixth distance is greater than 18 μm.

In the display panel of the present disclosure, a width of the openings is 16 μm, and a sum of the fifth distance and the sixth distance is 56 μm.

The present disclosure further provides an electronic equipment including the display panel as described in any one of the above.

In the display panel of the present disclosure, a contact area between a drain of a clock input transistor of a pull-up module in a $m1^{th}$ GOA unit and an active layer is less than a contact area between a drain of a clock input transistor of a pull-up module in a $m2^{th}$ GOA unit and the active layer.

The present disclosure further provides an electronic equipment including a display panel, the display panel includes a color filter substrate and an array substrate that are oppositely disposed, and the color filter substrate includes:

a base substrate;

a plurality of black matrices formed on the base substrate and including openings for filling with color filter layers; and a plurality of color filter layers formed within the openings;

wherein the color filter substrate includes a plurality of pixel regions arranged in an array and corresponding to sub-pixels; the pixel region includes a first region corresponding to the opening as well as a second region surrounding the first region, and the black matrix is formed on the second region; the second region includes a first side region and a second side region which are arranged in a row direction and parallel to each other as well as a third side region and a fourth side region which are arranged in a column direction and parallel to each other; and a fifth distance from a side of the first side region away from the opening to the opening is less than a sixth distance from a side of the second side region away from the opening to the opening.

In the electronic equipment of the present disclosure, the display panel includes:

m gate on array (GOA) units arranged in the column direction, wherein the GOA unit includes a pull-up module which includes a clock input transistor connected with a clock signal;

n clock signal lines extending in the column direction and arranged in parallel; and m clock signal connection lines extending in the row direction and arranged in parallel, wherein the clock signal connection lines correspond to the GOA units one by one, and are used to connect the clock input transistor of the pull-up module in the GOA unit to the corresponding clock signal line;

wherein the n clock signal lines include a $n1^{th}$ clock signal line and a $n2^{th}$ clock signal line; the $n2^{th}$ clock signal line is formed on a side of the $n1^{th}$ clock signal line away from the GOA units; and a voltage drop value of the clock input transistor of the pull-up module in a $m1^{th}$ GOA unit connected with the $n1^{th}$ clock signal line is greater than a voltage drop value of the clock input transistor of the pull-up module in a $m2^{th}$ GOA unit connected with the $n2^{th}$ clock signal line.

In the electronic equipment of the present disclosure, a size of the clock input transistor of the pull-up module in the $m1^{th}$ GOA unit is greater than a size of the clock input transistor of the pull-up module in the $m2^{th}$ GOA unit.

In the electronic equipment of the present disclosure, the clock input transistor includes a plurality of sub-transistors connected in an array, and a number of the sub-transistors of the clock input transistor of the pull-up module in the $m1^{th}$ GOA unit is more than a number of the sub-transistors of the clock input transistor of the pull-up module in the $m2^{th}$ GOA unit.

In the electronic equipment of the present disclosure, a source area of the clock input transistor of the pull-up module in the $m1^{th}$ GOA unit is greater than a source area of the clock input transistor of the pull-up module in the $m2^{th}$ GOA unit, and/or a drain area of the clock input transistor of the pull-up module in the $m1^{th}$ GOA unit is greater than a drain area of the clock input transistor of the pull-up module in the $m2^{th}$ GOA unit.

In the electronic equipment of the present disclosure, a contact area between a source of the clock input transistor of the pull-up module in the $m1^{th}$ GOA unit and an active layer is less than a contact area between a source of the clock input transistor of the pull-up module in the $m2^{th}$ GOA unit and the active layer.

In the electronic equipment of the present disclosure, a $n^{th}$ GOA unit includes:

a pull-up control module connected with a first node and used to pull up a potential of the first node during a display time period;

a logical address module including a second node and connected with the first node, wherein the logical address module is used to pull up a potential of the second node twice during the display time period, and pull up the potential of the first node by the second node during a blank time period;

the pull-up module connected with the first node and used to pull up potentials of a $n^{th}$ stage transfer signal, a first output signal, and a second output signal;

a first pull-down module connected with the first node and used to pull down the potential of the first node during the blank time period;

a second pull-down module connected with the first node and a third node, and used to pull down the potential of the first node and a potential of the third node during the display time period;

a third pull-down module connected with the third node and the second pull-down module, and used to pull down the potential of the third node during the blank time period;

a first pull-down maintaining module including the third node, connected with the first node and the first pull-down module, and used to maintain a low potential of the first node; and a second pull-down maintaining module connected with the third node and the pull-up module, and used to maintain low potentials of the $n^{th}$ stage transfer signal, the first output signal, and the second output signal.

In the electronic equipment of the present disclosure, a gate and a first electrode of the first transistor as well as a gate of the second transistor are connected with a $n-2^{th}$ stage transfer signal, a second electrode of the first transistor is connected with a first electrode and a fourth node of the second transistor, and a second electrode of the second transistor is connected with the first node.

In the electronic equipment of the present disclosure, a material resistivity of a source/drain layer of the clock input transistor of the pull-up module in the $m1^{th}$ GOA unit is greater than a material resistivity of a source/drain layer of the clock input transistor of the pull-up module in the $m2^{th}$ GOA unit.

In the electronic equipment of the present disclosure, a thickness of a source/drain layer of the clock input transistor of the pull-up module in the $m1^{th}$ GOA unit is less than a thickness of a source/drain layer of the clock input transistor of the pull-up module in the $m2^{th}$ GOA unit.

In the electronic equipment of the present disclosure, a contact area between a drain of the clock input transistor of the pull-up module in the $m1^{th}$ GOA unit and an active layer is less than a contact area between a drain of the clock input transistor of the pull-up module in the $m2^{th}$ GOA unit and the active layer.

Advantageous Effects

The advantageous effects of the present disclosure are that: the present disclosure provides a mask, a display panel, and an electronic equipment. The mask includes a mask substrate and an opening pattern formed on the mask substrate. The mask includes a plurality of repeat regions, and the repeat region includes a first region corresponding to the opening pattern and a second region surrounding the first region. The second region includes a first side region and a second side region which are arranged in a row direction and parallel to each other as well as a third side region and a fourth side region which are arranged in a column direction and parallel to each other. A first distance from a side of the first side region away from the opening pattern to the opening pattern is less than a second distance from a side of the second side region away from the opening pattern to the opening pattern. This mask does not employ opening patterns of conventional masks, such as a design that a shading zone corresponds to a center of the repeat region (for forming a pixel region), and moves the opening pattern to a side, so that a black matrix opening or a color filter layer with a target size can be obtained based on a diffraction effect, and a size of the opening pattern does not require to be changed. Based on this structure, the display panels with the same resolution and different sizes may use the masks with the same size, and differences between these masks are merely different distances between the opening patterns and edges of the repeat regions, thus solving at least one technical problem existing in conventional 8K electronic equipment that the masks with different sizes require to be manufactured for the display panels with the different sizes, and decreasing manufacturing costs of products.

DESCRIPTION OF DRAWINGS

In order to clearly illustrate technical solutions in embodiments or in the prior art, the drawings required for using in the description of the embodiments or the prior art is briefly described below. Obviously, the drawings in the following description are only some of the embodiments of the present disclosure. For those skilled in the art, other drawings may also be obtained in accordance with these drawings without making for creative efforts.

DETAILED DESCRIPTION OF PREFERRED EMBODIMENTS

Figure 1:
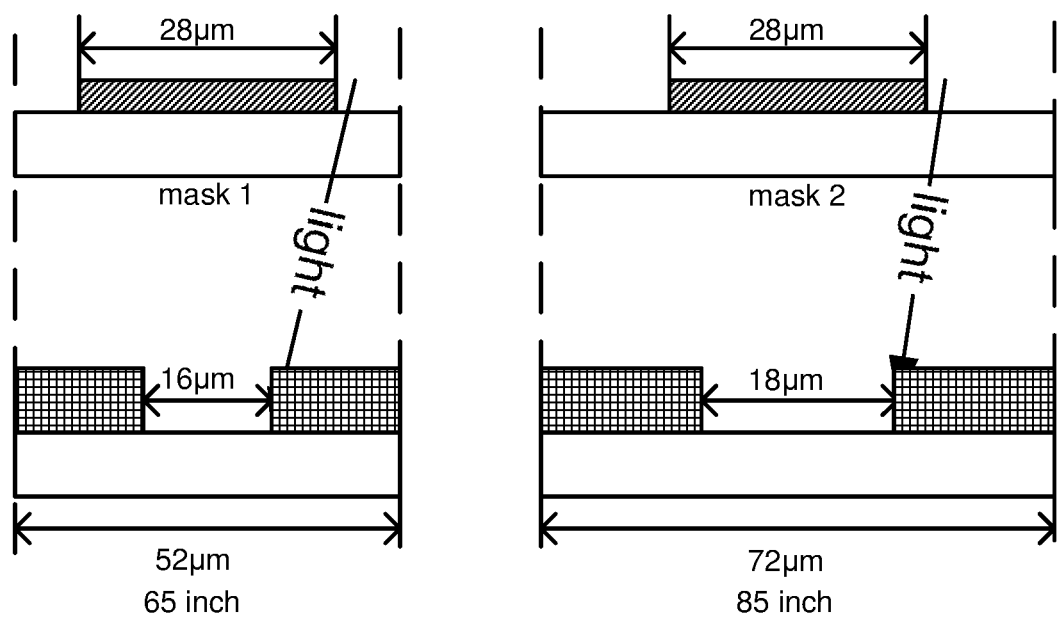
FIG. 1 is a schematic view of an effect of a mask in the prior art.

The description of the following respective embodiments refers to accompanying drawings to exemplify the particular embodiments which may be implemented by the present disclosure. Directional terms mentioned by the present disclosure, such as "upper", "lower", "front", "back", "left", "right", "inner", "outer", "side", etc., are only directions by referring to the accompanying drawings. Therefore, the used directional terms are applied to illustrate and understand the present disclosure, but not to limit the present disclosure. In the drawings, units with similar structures are denoted by the same reference numerals.

In combination with accompanying drawings in the embodiments of the present disclosure below, technical solutions in the embodiments of the present disclosure are clearly and completely described. Obviously, the described embodiments are merely a part of the embodiments of the present disclosure, rather than all the embodiments. Based on the embodiments in the present disclosure, all of other embodiments obtained by those skilled in the art without making for creative efforts belong to the scope protected by the present disclosure.

In the description of the present disclosure, it should be understood that indicative directions or position relations, such as terms "center", "longitudinal", "transverse", "length", "width", "thickness", "upper", "lower", "front", "back", "left", "right", "vertical", "horizontal", "top", "bottom", "inner", "outer", "clockwise", and "counterclockwise", are based on directions or position relations indicated by the accompanying drawings. The indicative directions or position relations are only for convenience of describing the present disclosure and simplifying the description, and do not indicate or imply that indicated devices or elements must have a specific orientation and be constructed and operated in a specific orientation. Therefore, the indicative directions or position relations cannot be understood to be limitation to the present disclosure. In addition, terms, such as "first" and "second", are only used for purposes of description, and do not be understood to indicate or imply relative importance or to imply numbers of indicated technical features. Thus, the features defined with "first" and "second" may explicitly or implicitly include one or more of the features. In the description of the present disclosure, term "a plurality of" means two or more than two, unless specified otherwise.

In the description of the present disclosure, it should be noted that unless specified or limited otherwise, terms "mounted", "linked", and "connected" are understood broadly, and may be, for example, fixed connection, detachable connection or integral connection; may be mechanical connection or electrical connection or may communicate with each other; may be direct connection or indirect connection via intermediate media; may be inner communication of two elements or interaction between two elements. For those of ordinary skill in the art, the specific meaning of the above-mentioned terms may be understood according to specific situations.

In the present disclosure, unless specified or limited otherwise, a structure in which a first feature is "on" or "below" a second feature may include direct contact between the first feature and the second feature, and may also include indirect contact between the first feature and the second feature via additional features formed therebetween. Moreover, a structure in which the first feature "on," "above," or "on top of" the second feature may include a structure in which the first feature is directly or obliquely above the second feature, or merely means that a height of the first feature is higher than a height of the second feature, and a structure in which the first feature "below," "under," or "on bottom of" the second feature may include a structure in which the first feature is directly or obliquely under the second feature, or merely means that a height of the first feature is lower than a height of the second feature.

Various embodiments and examples are provided in the following disclosure to realize different structures of the present disclosure. In order to simplify the present disclosure, components and settings of the particular examples are described below. However, these components and settings are only by way of example, and are not intended to limit the present disclosure. In addition, reference numerals and/or reference letters may be repeated in different examples in the present disclosure. This repeating is for the purposes of simplification and clarity, and does not refer to relations between various embodiments and/or settings. Furthermore, examples of various particular processes and materials are provided in the present disclosure, but those of ordinary skill in the art may appreciate applications of other processes and/or use of materials.

Sub-pixels of each pixel of a liquid-crystal display panel are arranged in rows. In the present disclosure, an arrangement direction of the sub-pixels is a row direction, a direction perpendicular to the row direction is a column direction, and a row width refers to a width of a certain area in the row direction.

In the present disclosure, a repeat region refers to a region on a mask, and the mask consists of the repeat regions that are regularly distributed. A pixel region refers to a region corresponding to a smallest light-emitting unit (i.e., the sub-pixel) and includes a light-emitting zone and a shading zone surrounding the light-emitting zone. In processes of manufacturing the display panel, the repeat region of the mask is aligned with the pixel region of a substrate to achieve to align the mask with the substrate.

FIG. 1 is a schematic view of an effect of a mask in the prior art. A shading zone of the mask is disposed on a middle of a pixel region. As shown in FIG. 1, a row width of a single sub-pixel in a 65-inch display panel with 8K resolution is 52 μm, and a row width of the pixel region of the mask 1 corresponding to the 65-inch display panel with the 8K resolution is also 52 μm; a row width of a single sub-pixel in a 85-inch display panel with 8K resolution is 72 μm, and a row width of the pixel region of the mask 2 corresponding to the 85-inch display panel with the 8K resolution is also 72 μm. If the masks with the same size are employed, when a row width of a shading zone is 28 μm, a row width of a single light-transmitting zone of the mask 1 is 12 μm, and a row width of a single light-transmitting zone of the mask 2 is 22 μm. During a photolithography process, the light-transmitting zones form slits, and light is diffracted through the slits. Based on a principle of light diffraction, the smaller the slits are, the wider a diffraction range of the light is.

Since the black matrix is a negative photoresist, an area which is not exposed to the light is etched to form an opening. Thus, as shown in FIG. 1, a row width of an actual effective shading range of the shading zone on the mask 1 is 16 μm (i.e., a diffraction range of the single slit is 6 μm), and a row width of a formed light-emitting zone of the single sub-pixel of the 65-inch display panel with the 8K resolution is 16 μm; a row width of an actual effective shading range of the shading zone on the mask 2 is 18 μm (i.e., a diffraction range of the single slit is 5 μm), and a row width of a formed light-emitting zone of the single sub-pixel of the 85-inch display panel with the 8K resolution is 18 μm, which are consistent with the principle of light diffraction. However, since the row width of the light-emitting zone of the single sub-pixel of the 65-inch display panel with the 8K resolution is different from the row width of the light-emitting zone of the single sub-pixel of the 85-inch display panel with the 8K resolution, the masks with different size requires to be used when an RGB color filter layer is subsequently formed.

Therefore, the conventional 8K electronic equipment at least has a technical problem that the masks with the different sizes requires to be manufactured for the display panels with the different sizes, which requires to be improved. Hence, the present disclosure provides a mask, a display panel, and an electronic equipment to solve the at least one technical problem existing in the conventional 8K electronic equipment that the masks with the different sizes require to be manufactured for the display panels with the different sizes.

Figure 2A:
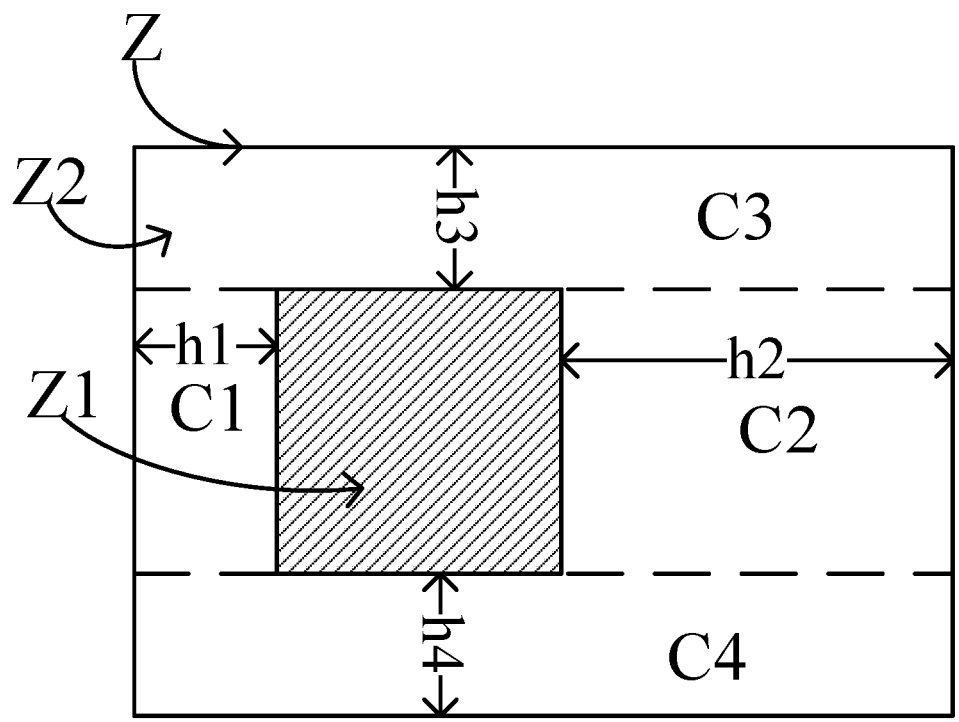
FIG. 2a is a top view of a repeat region of a mask provided by embodiments of the present disclosure.
Figure 2B:
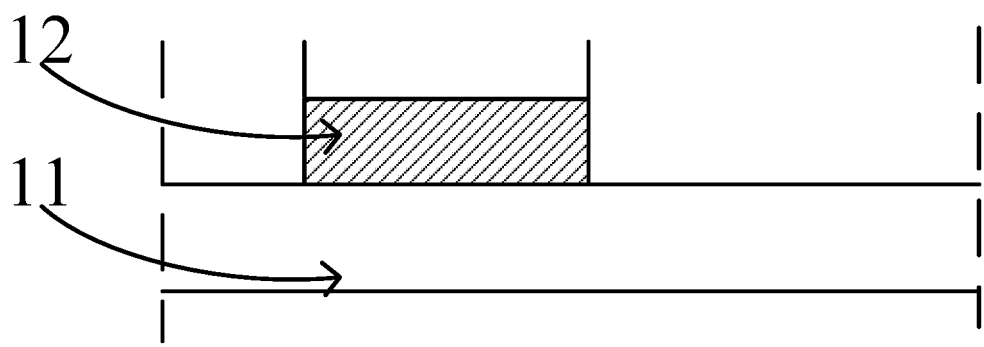
FIG. 2b is a sectional view of the repeat region of the mask provided by the embodiments of the present disclosure.

As shown in FIG. 2a and FIG. 2b, the mask provided by the present disclosure includes:
  a mask substrate 11; and
  an opening pattern 12 formed on the mask substrate 11 and used to form a black matrix or a color filter layer of a color filter substrate, wherein the black matrix includes an opening for filling with the color filter layer;
  wherein the mask includes a plurality of repeat regions Z, and the repeat region Z includes a first region Z1 corresponding to the opening pattern 12 and a second region Z2 surrounding the first region Z1; the second region Z2 includes a first side region C1 and a second side region C2 which are arranged in a row direction and parallel to each other as well as a third side region C3 and a fourth side region C4 which are arranged in a column direction and parallel to each other; and a first distance h1 from a side of the first side region C1 away from the opening pattern 12 to the opening pattern 12 is less than a second distance h2 from a side of the second side region C2 away from the opening pattern 12 to the opening pattern 12.

The embodiment provides a mask. The mask includes a mask substrate and an opening pattern formed on the mask substrate and used to form a black matrix or a color filter layer of a color filter substrate, and the black matrix includes an opening for filling with the color filter layer. The mask includes a plurality of repeat regions, and the repeat region includes a first region corresponding to the opening pattern and a second region surrounding the first region. The second region includes a first side region and a second side region which are arranged in a row direction and parallel to each other as well as a third side region and a fourth side region which are arranged in a column direction and parallel to each other. A first distance from a side of the first side region away from the opening pattern to the opening pattern is less than a second distance from a side of the second side region away from the opening pattern to the opening pattern. This mask does not employ opening patterns of conventional masks, such as a design that a shading zone corresponds to a center of the repeat region (for forming a pixel region), and moves the opening pattern to a side, so that the black matrix opening or the color filter layer with a target size can be obtained based on a diffraction effect, and a size of the opening pattern does not require to be changed. Based on this structure, the display panels with the same resolution and different sizes may use the masks with the same size, and differences between these masks are merely different distances between the opening patterns and edges of the repeat regions, thus solving at least one technical problem existing in conventional 8K electronic equipment that the masks with different sizes require to be manufactured for the display panels with the different sizes, and decreasing manufacturing costs of products.

In an embodiment, a third distance h3 from a side of the third side region C3 away from the opening pattern 12 to the opening pattern 12 is equal to a fourth distance h4 from a side of the fourth side region C4 away from the opening pattern 12 to the opening pattern 12.

In an embodiment, when the mask is used to manufacture the 85-inch (or above 85-inch) display panel with the 8K resolution, the first distance h1 is less than 12 μm, and the second distance h2 is greater than 32 μm.

In an embodiment, when the mask is used to manufacture the 85-inch (or above 85-inch) display panel with the 8K resolution, the first distance h1 is less than 10 μm, and the second distance h2 is greater than 34 μm.

In an embodiment, when the mask is used to manufacture the 65-inch (or above 65-inch) display panel with the 8K resolution, a width of the opening pattern 12 in the row direction is 28 μm.

In an embodiment, when the mask is used to manufacture the 85-inch display panel with the 8K resolution, a sum of the first distance h1 and the second distance h2 is 44 μm in the mask of the present disclosure.

In an embodiment, the opening pattern 12 is formed by patterning material with 0% light transmittance, and the material includes metal chromium and the like.

In an embodiment, a line with the 0% light transmittance is formed between the repeat regions Z adjacent to each other, thus ensuring a slit effect. Since a width of the line is less than 1 μm, the pattern of the black matrix below the region does not be affected.

Figure 3A:
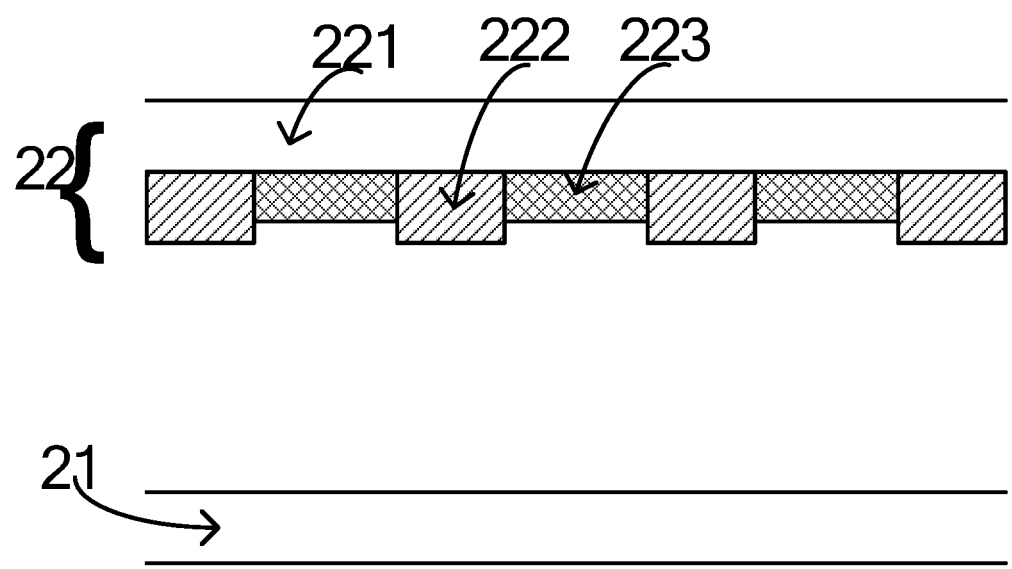
FIG. 3a is a schematic view of a structure of a display panel provided by embodiments of the present disclosure.
Figure 3B:
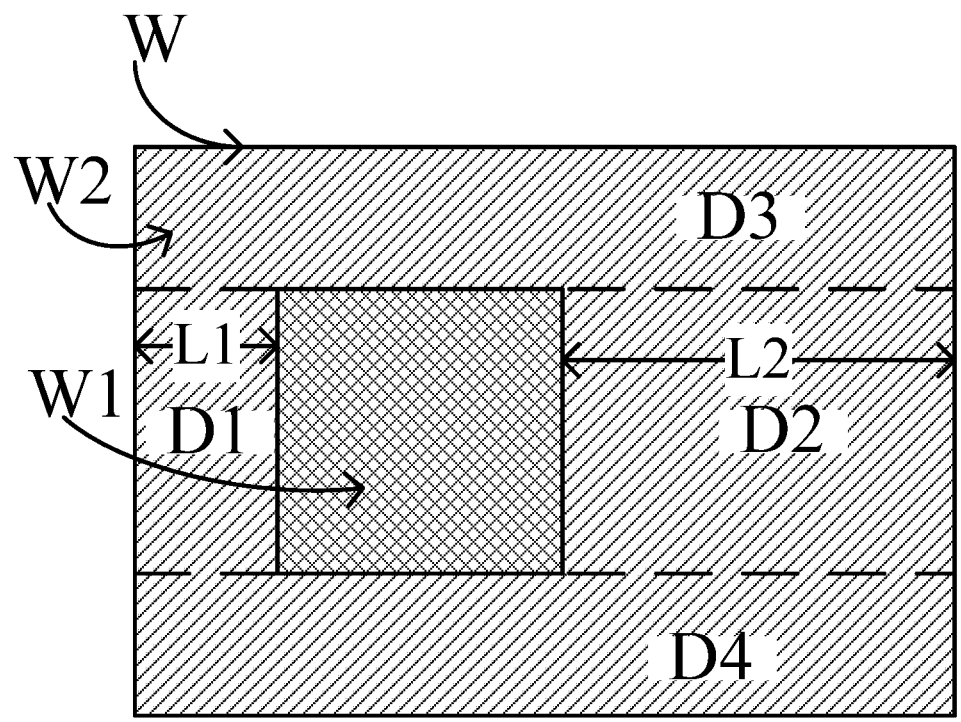
FIG. 3b is a top view of a pixel region of a color filter substrate provided by embodiments of the present disclosure.
Figure 3C:
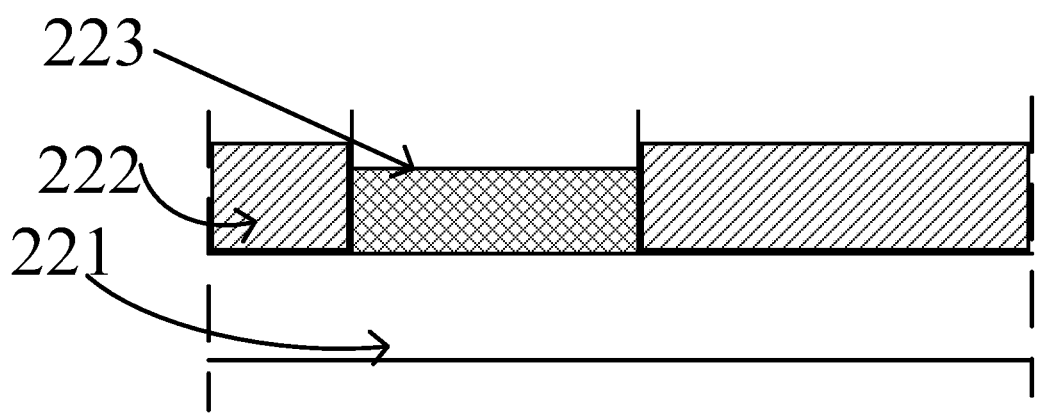
FIG. 3c is a sectional view of the pixel region of the color filter substrate provided by the embodiments of the present disclosure.

As shown in FIGS. 3a, 3b, and 3c, a display panel provided by embodiments of the present disclosure includes: an array substrate 21 and a color filter substrate 22 that are oppositely disposed. The color filter substrate 22 includes:

a base substrate 221;

a plurality of black matrices 222 formed on the base substrate and including openings for filling with color filter layers 223; and a plurality of color filter layers 223 formed within the openings;

wherein as shown in FIG. 3b and FIG. 3c, the color filter substrate 22 includes a plurality of pixel regions W arranged in an array and corresponding to sub-pixels; the pixel region W includes a first region W1 corresponding to the opening as well as a second region W2 surrounding the first region W1, and the black matrix 222 is formed on the second region W2; the second region W2 includes a first side region D1 and a second side region D2 which are arranged in a row direction and parallel to each other as well as a third side region D3 and a fourth side region D4 which are arranged in a column direction and parallel to each other; and a fifth distance L1 from a side of the first side region D1 away from the opening to the opening is less than a sixth distance L2 from a side of the second side region away from the opening to the opening.

The embodiment provides a display panel. A color filter substrate of the display panel includes: a base substrate; a plurality of black matrices formed on the base substrate and including openings for filling with color filter layers; and a plurality of color filter layers formed within the openings. The color filter substrate includes a plurality of pixel regions arranged in an array and corresponding to sub-pixels. The pixel region includes a first region corresponding to the opening as well as a second region surrounding the first region, and the black matrix is formed on the second region. The second region includes a first side region and a second side region which are arranged in a row direction and parallel to each other as well as a third side region and a fourth side region which are arranged in a column direction and parallel to each other. A fifth distance from a side of the first side region away from the opening to the opening is less than a sixth distance from a side of the second side region away from the opening to the opening. Based on this structure, the display panels with the same resolution and different sizes may use the masks with the same size, and the differences between these masks are merely the different distances between the opening patterns and the edges of the pixel regions, thus solving the at least one technical problem existing in the conventional 8K electronic equipment that the masks with the different sizes require to be manufactured for the display panels with the different sizes, and decreasing the manufacturing costs of the products.

In an embodiment, in the 85-inch (or above 85-inch) display panel with the 8K resolution, the fifth distance L1 is less than 18 μm, and the sixth distance L2 is greater than 18 μm in the row direction.

In an embodiment, in the 85-inch display panel with the 8K resolution, a width of the openings is 16 μm, and a sum of the fifth distance L1 and the sixth distance L2 is 56 μm in the row direction.

Figure 4A:
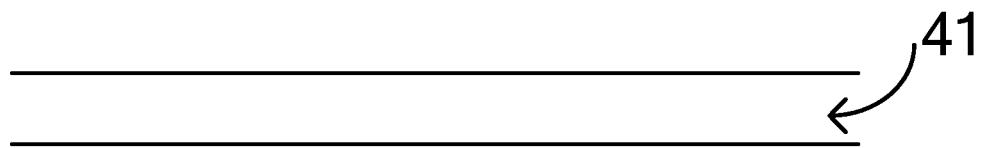
FIGS. 4a to 4o are schematic views of manufacturing the display panel provided by the embodiments of the present disclosure.
Figure 4B:
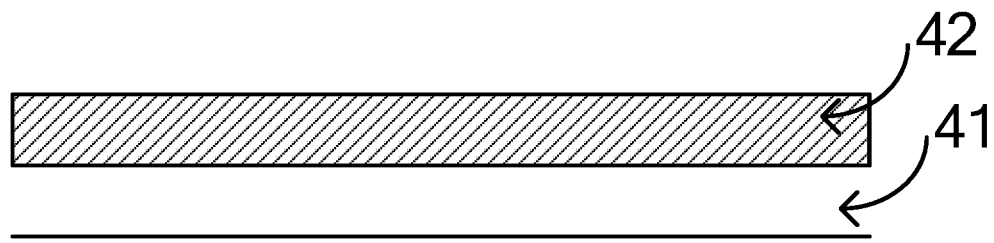
Figure 4C:
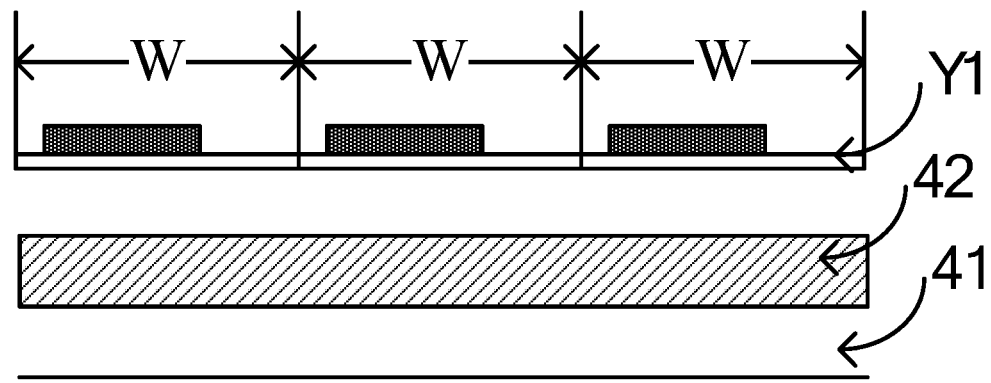
Figure 4D:
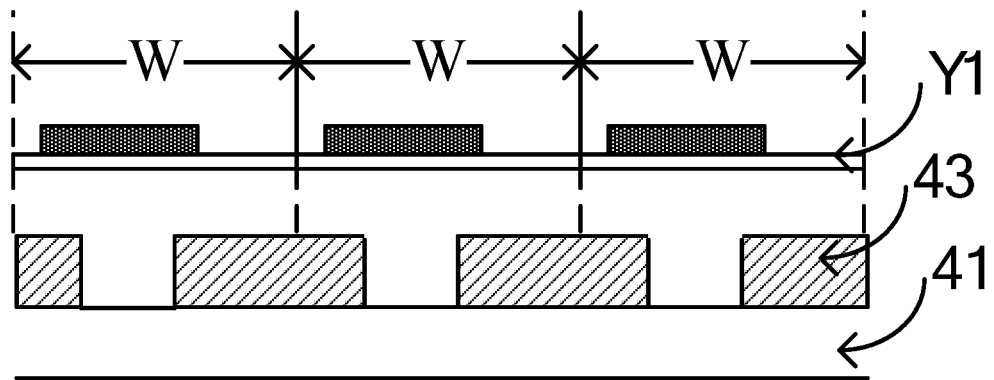
Figure 4E:
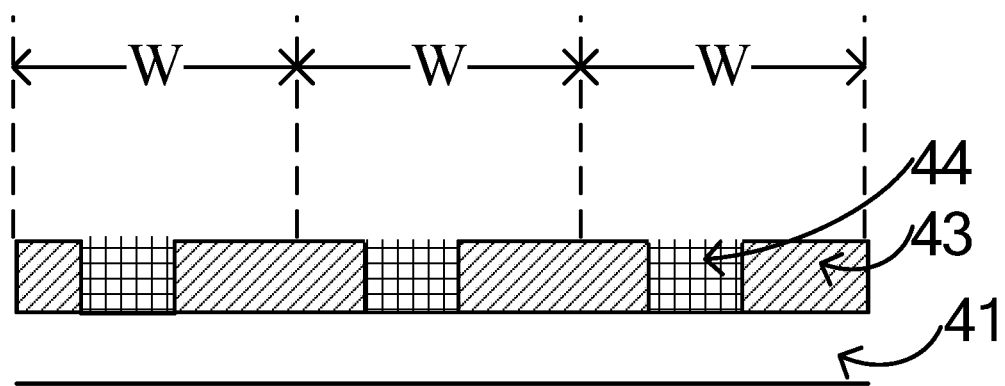
Figure 4F:
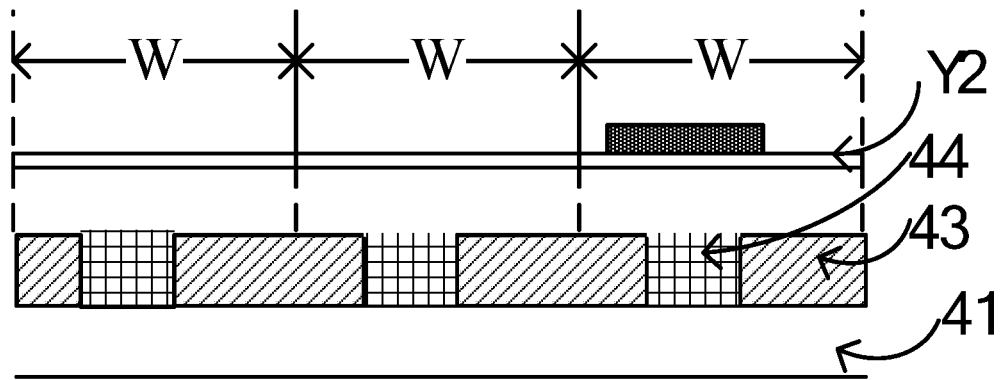
Figure 4G:
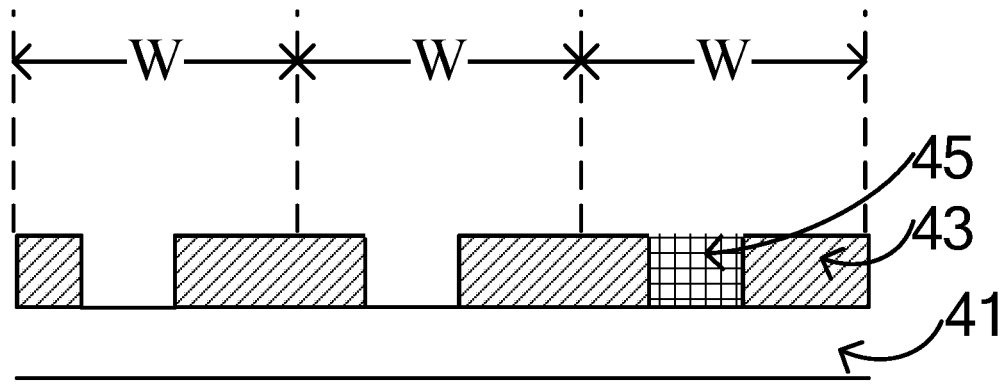
Figure 4H:
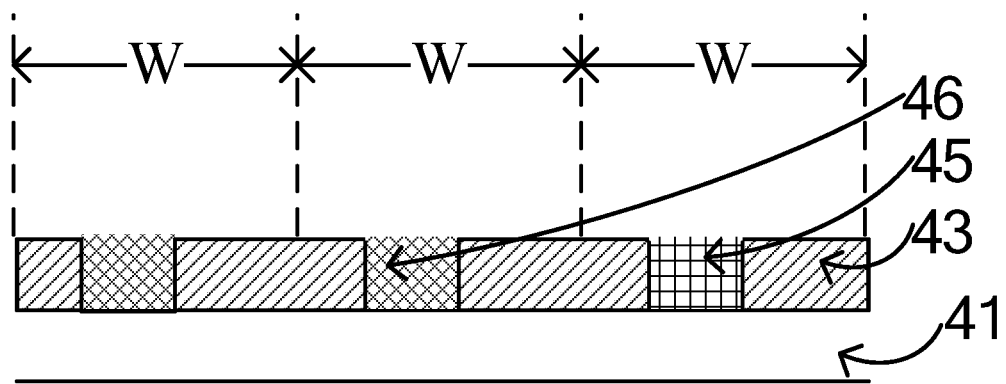
Figure 4I:
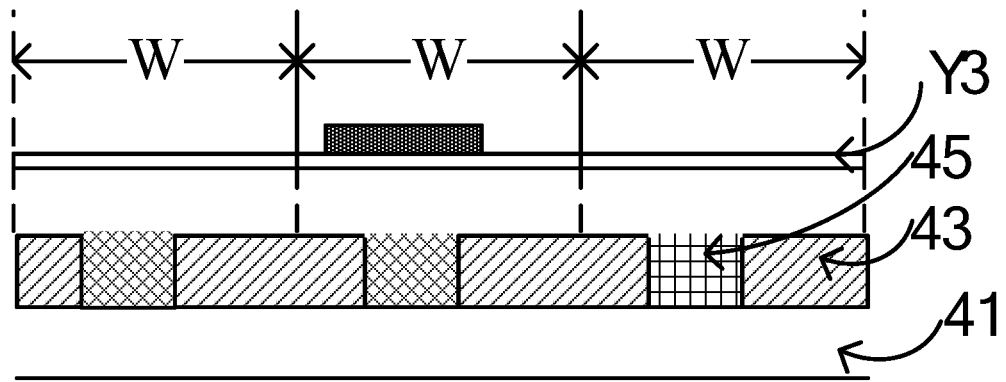
Figure 4J:
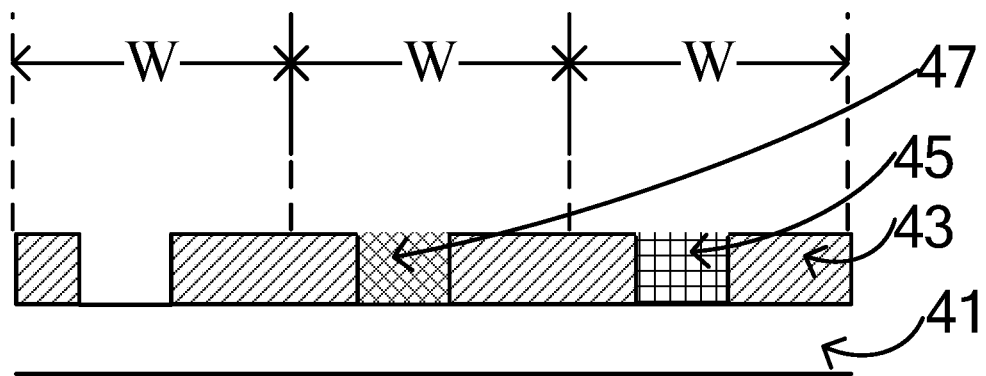
Figure 4K:
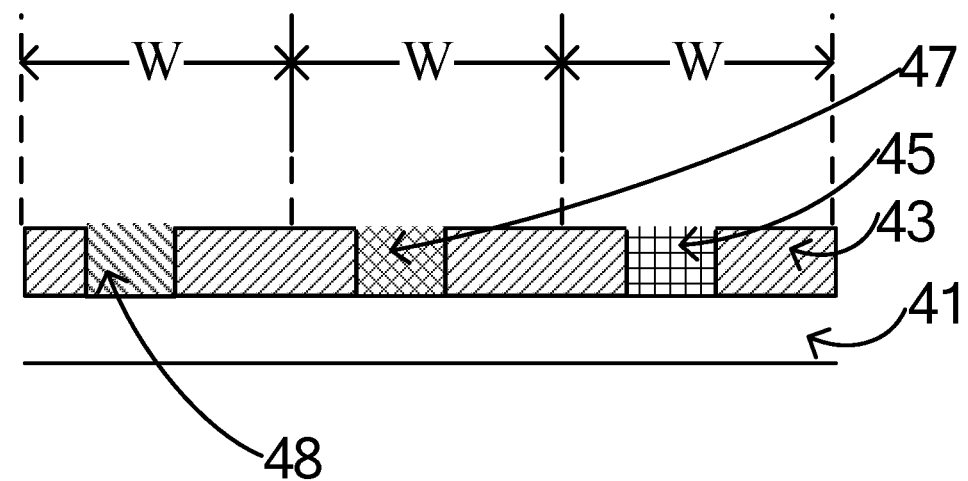
Figure 4L:
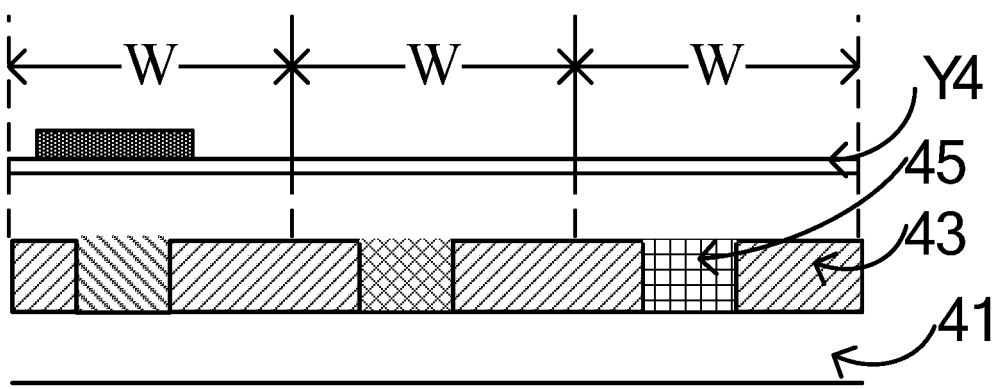
Figure 4M:
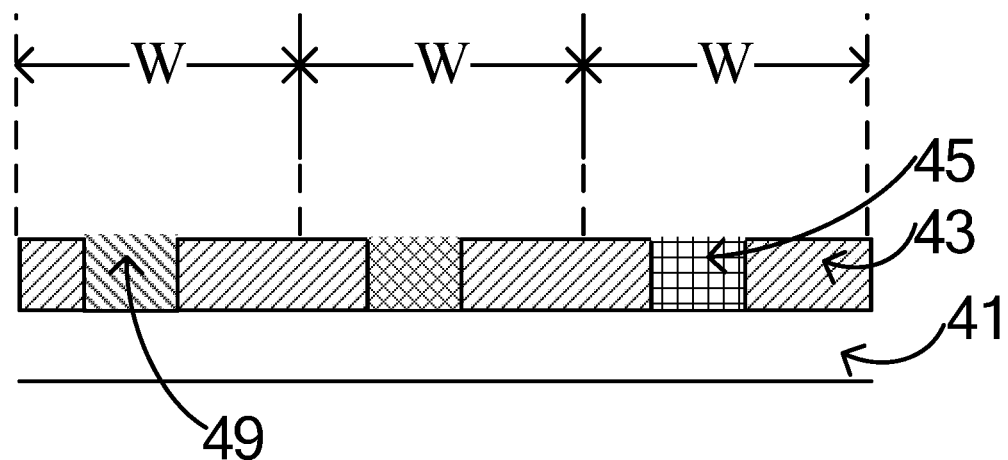
Figure 4N:
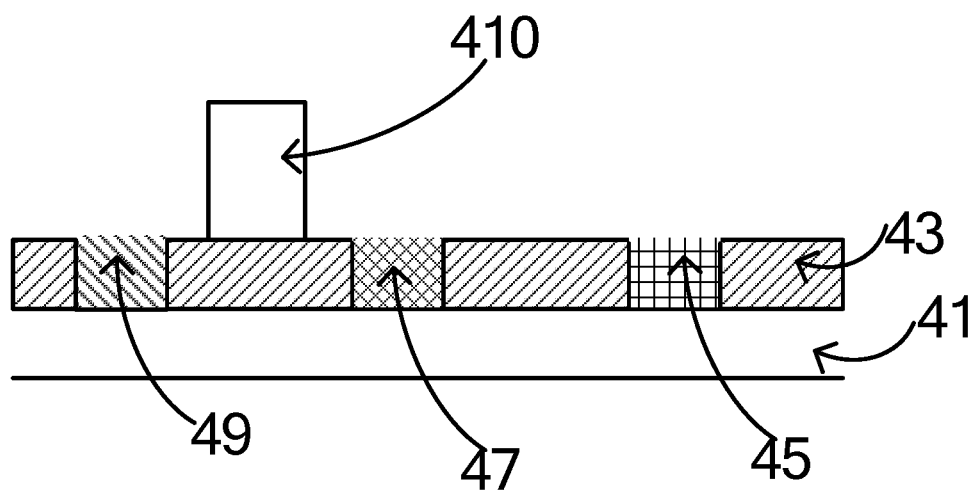
Figure 4O:
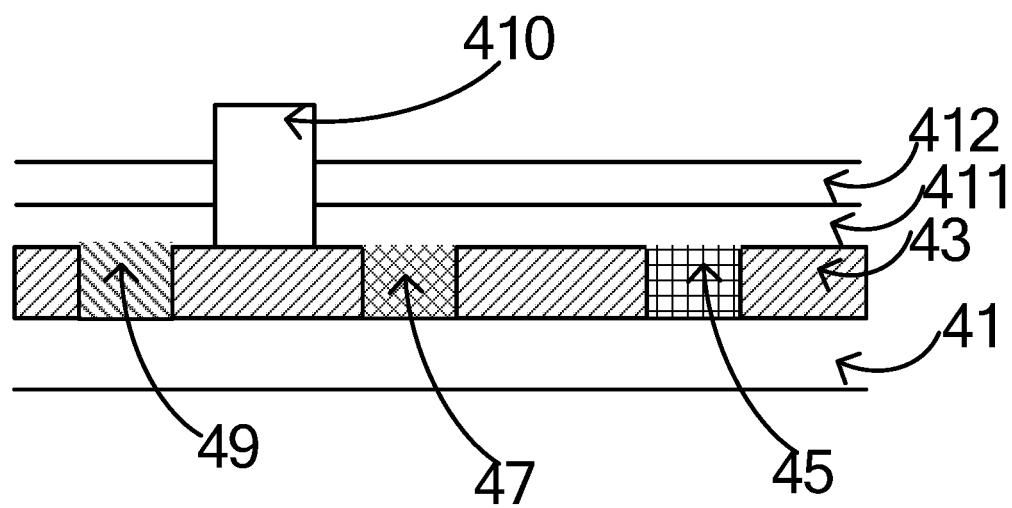

In an embodiment, in order to obtain the color filter substrate in the embodiment shown in FIG. 3a, the embodiment of the present disclosure further provides a method for manufacturing the color filter substrate as follows, as shown in FIG. 4a to FIG. 4o. The method includes steps as follows:

a step 1 of providing a base substrate.

As shown in FIG. 4a, a transparent glass substrate is provided to be the base substrate 41.

a step 2 of forming a black matrix material layer on the base substrate.

As shown in FIG. 4b, the black matrix material layer is formed on the base substrate 41, such as the transparent glass substrate. Since the material of the black matrix material layer is a negative photoresist, areas which are not shaded by a mask are removed.

a step 3 of aligning a first mask with the base substrate.

As shown in FIG. 4c, the first mask Y1 is applied. Each of repeat regions Z of the first mask Y1 corresponding a pixel region W employs the designs of the embodiments shown in FIG. 2a and FIG. 2b. The first mask Y1 is aligned with the base substrate obtained from the step 2.

a step 4 of patterning the black matrix material layer to form the black matrices.

As shown in FIG. 4d, based on the first mask, the black matrix material layer 42 is subjected to the photolithography process by using an apparatus, such as an exposer, to obtain the black matrices 43.

a step 5 of coating a red photoresist layer.

As shown in FIG. 4e, the red photoresist layer 44 is coated on an entire surface of the base substrate obtained from the step 4. Since material of the red photoresist layer is a positive photoresist, areas which are shaded by the mask remains.

a step 6 of aligning a second mask with the base substrate.

As shown in FIG. 4f, the second mask Y2 is applied. The designs of the embodiments shown in FIG. 2a and FIG. 2b are only employed by the repeat regions Z of the second mask Y2 corresponding the pixel regions W corresponding to red sub-pixels. The second mask Y2 is aligned with the base substrate obtained from the step 5.

a step 7 of patterning the red photoresist layer.

As shown in FIG. 4g, based on the second mask, the red photoresist layer 44 is subjected to the photolithography process by using the apparatus, such as the exposer, to obtain red filter layers 45.

a step 8 of coating a green photoresist layer.

As shown in FIG. 4h, the green photoresist layer 46 is coated on an entire surface of the base substrate obtained from the step 7. Since material of the green photoresist layer is a positive photoresist, areas which are shaded by the mask remains.

a step 9 of aligning a third mask with the base substrate.

As shown in FIG. 4i, the third mask Y3 is applied. The designs of the embodiments shown in FIG. 2a and FIG. 2b are only employed by the repeat regions Z of the third mask Y3 corresponding the pixel regions W corresponding to green sub-pixels. The third mask Y3 is aligned with the base substrate obtained from the step 8.

a step 10 of patterning the green photoresist layer.

As shown in FIG. 4j, based on the third mask, the green photoresist layer 46 is subjected to the photolithography process by the apparatus, such as the exposer, to obtain green filter layers 47.

a step 11 of coating a blue photoresist layer.

As shown in FIG. 4k, the blue photoresist layer 48 is coated on an entire surface of the base substrate obtained from the step 10. Since material of the blue photoresist layer is a positive photoresist, areas which are shaded by the mask remains.

a step 12 of aligning a fourth mask with the base substrate.

As shown in FIG. 4l, the fourth mask Y4 is applied. The designs of the embodiments shown in FIG. 2a and FIG. 2b are only employed by the repeat regions Z of the fourth mask Y4 corresponding the pixel regions W corresponding to blue sub-pixels. The fourth mask Y4 is aligned with the base substrate obtained from the step 11.

a step 13 of patterning the blue photoresist layer.

As shown in FIG. 4m, based on the fourth mask, the blue photoresist layer 48 is subjected to the photolithography process by the apparatus, such as the exposer, to obtain blue filter layers 49.

a step 14 of manufacturing a photo spacer.

As shown in FIG. 4n, the photo spacer 410 are manufactured on the black matrix of the base substrate obtained from the step 13.

a step 15 of manufacturing a planarization layer and a common electrode layer.

As shown in FIG. 4o, the planarization layer 411, which is made from macromolecular organic particles, and the common electrode layer 412, which is made from a transparent conductive material, such as TIO, are manufactured on the base substrate obtained from the step 14 in sequence.

In addition to the technical problem that the masks with the different sizes require to be manufactured for the display panels with the different sizes, the display panels with 8K ultra-high resolution also have the following technical problems:

An area of a single sub-pixel of the electronic equipment with 8K resolution is quarter of an area of a single sub-pixel of the electronic equipment with 4K resolution, which is accompanied by decreasing a contact area between photo spacers (ps) inside the display panel and a bottom layer. In the electronic equipment with 8K resolution, the contact area between the photo spacer and the bottom layer is 20 μm*20 μm or even smaller. Such a small contact area results in the photo spacers easily peeling from the bottom layer, and the peeling of the photo spacers may result in the problems, such as blank edges existing in liquid crystal and abnormal pressure on the entire surface.

For the electronic equipment with the 8K ultra-high resolution, a loading (voltage drop) is large, a charging time is short, and GOA driving and a design of thick copper are employed, which cause the electronic equipment with the ultra-high resolution to be extremely sensitive to an impedance difference between each clock (CK) signal in the GOA. The resolution of the 8K electronic equipment is 7680*4320, and the 8K electronic equipment has a total of 4320 rows GOA units and employs a GOA driving architecture with 12 CK signal lines (i.e., 12 clock signal lines). The impedance difference of the CK signal line may reach an order of kiloohms, and the impedance difference may result in a difference between a CK pattern and a waveform of a scan line output by the corresponding GOA unit, thereby causing problems, such as horizontal lines shown on the display panel.

Figure 5:
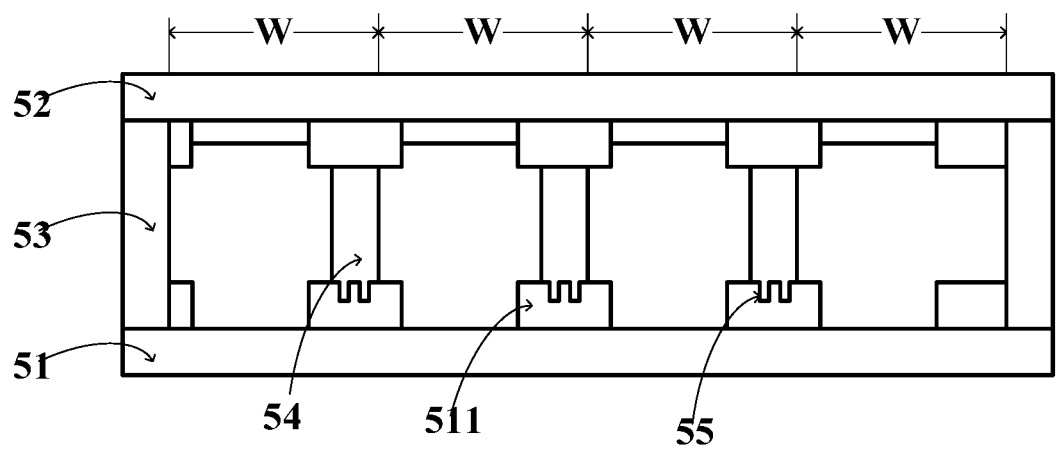
FIG. 5 is a schematic view of another structure of the display panel provided by embodiments of the present disclosure.

In order to solve these technical problems, in an embodiment, as shown in FIG. 5, the display panel provided by the embodiment of the present disclosure includes:

an array substrate 51 provided with a driving circuit layer and pixel electrodes;

a color filter substrate 52 disposed opposite to the array substrate;

a plastic frame 53 used for packaging the array substrate 51 and the color filter substrate 52 and forming a sealed space with the array substrate and the color filter substrate, wherein the sealed space is filled with liquid crystal;

a plurality of photo spacers 54 forming on the array substrate 51 or the color filter substrate and used for supporting the array substrate 51 and the color filter substrate 52.

In an embodiment, as shown in FIG. 5, in each of the pixel regions W, the color filter substrate 52 employs the structure provided by any one of the above embodiments, or is manufactured by the masks provided by any of the embodiments.

Figure 6:
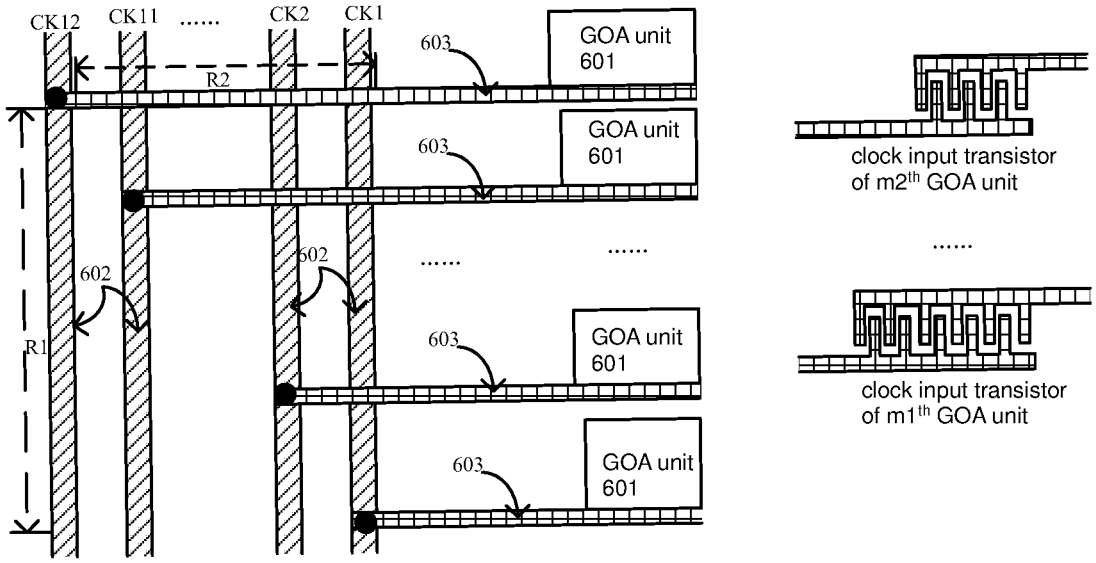
FIG. 6 is a schematic view of a circuit of the display panel provided by embodiments of the present disclosure.

In an embodiment, for the technical problem about the CK impedance difference, as shown in FIG. 6, in a non-display area at which the plastic frame 53 located, the display panel is provided with:

m GOA units 601 arranged in a column direction, wherein the GOA unit 601 includes a pull-up module which includes a clock input transistor connected with a clock signal;

n clock signal lines 602 extending in the column direction and arranged in parallel; and m clock signal connection lines extending in a row direction and arranged in parallel, wherein the clock signal connection lines 603 correspond to the GOA units 601 one by one, and are used to connect the clock input transistor of the pull-up module in the GOA unit 601 to the corresponding clock signal line 602;

wherein the n clock signal lines include a $n1^{th}$ clock signal line and a $n2^{th}$ clock signal line; the $n2^{th}$ clock signal line is formed on a side of the $n1^{th}$ clock signal line away from the GOA units; a voltage drop value of the clock input transistor of the pull-up module in a $m1^{th}$ GOA unit connected with the $n1^{th}$ clock signal line is greater than a voltage drop value of the clock input transistor of the pull-up module in a $m2^{th}$ GOA unit connected with the $n2^{th}$ clock signal line; and n1 and n2 are different and belong to 1 to n, and m1 and m2 are different and belong to 1 to m.

When the display panel with the 7680*4320 of resolution is taken as an example, the display panel includes 4320 GOA units 601 and 12 clock signal lines 602 (CK1 to CK12 in FIG. 6), and each of the clock signal lines 602 is connected with 360 GOA units 601. Thus, it may be foreseen that in the column direction and the row direction, the difference between the voltage drop value of the GOA unit 601 connected with the CK12 and the voltage drop value of the GOA unit 601 connected with the CK1 is a product of a sum of resistance R1 and resistance R2 and current I, and the sum of the resistance R1 and the resistance R2 may reach the order of kiloohms. Based on this situation, the present disclosure abandons the improvement of the voltage drop of the clock signal line, and originally proposes to adjust parameters of the clock input transistor (i.e., thin film transistor connected with external clock signal) in the GOA unit to change the voltage drop value corresponding to this GOA unit.

The embodiment provides a display panel. The display panel includes: m GOA units arranged in a column direction, wherein the GOA unit includes a pull-up module which includes a clock input transistor connected with a clock signal; n clock signal lines extending in the column direction and arranged in parallel; and m clock signal connection lines extending in a row direction and arranged in parallel, wherein the clock signal connection lines correspond to the GOA units one by one, and are used to connect the clock input transistor of the pull-up module in the GOA unit to the corresponding clock signal line; wherein the clock signal lines include a $n1^{th}$ clock signal line and a $n2^{th}$ clock signal line; the $n2^{th}$ clock signal line is formed on a side of the $n1^{th}$ clock signal line away from the GOA units; and a voltage drop value of the clock input transistor of the pull-up module in a $m1^{th}$ GOA unit connected with the $n1^{th}$ clock signal line is greater than a voltage drop value of the clock input transistor of the pull-up module in a $m2^{th}$ GOA unit connected with the $n2^{th}$ clock signal line. Base on this circuit architecture, by adjusting the voltage drop values of the clock input transistors in the different GOA units, the voltage drop value caused by the different lengths of the clock signal line and the clock signal connection line may be compensated, thereby allowing the voltage drop values between each GOA unit and a clock driving chip to be approximately the same. Thus, the CK impedance difference in the electronic equipment with the 8K ultra-high resolution is ameliorated, and the technical problem that difference of the output signal of the GOA unit existing in the electronic equipment with the 8K ultra-high resolution is improved.

In an embodiment, the display panel includes an active layer, a first metal layer, and a second metal layer. The active layer is patterned to form channel regions of the transistors, the first metal region is patterned to form gates, gate scan lines, and the clock signal lines, and the second metal layer is patterned to form the clock signal connection lines, sources of the transistors, drains, and the like. In this case, the CK signals are connected with the sources of the clock input transistors in the GOA units. The CK signals are input through the clock signal lines (the first metal layer) and transmitted to the clock signal connection lines (the second metal layer) through via holes to connect the sources of the clock input transistor.

In an embodiment, the parameters of the clock input transistor include a size of the transistor, the material resistivity of the film layer, and a plurality of dimensions, such as a thickness of the film layer. According to the clock input transistors connected with the different clock signal lines, only one parameter may be adjusted, or multiple parameters may be adjusted at the same time, so that the voltage drop values between the GOA units, which are connected with all the clock signal lines, and the clock driving chip may be approximately the same.

In an embodiment, the voltage drop values of the clock input transistors which are connected to the same clock signal line, but belongs to the different GOA units are the same.

In an embodiment, the size parameters of the clock input transistors connected with the different clock signal lines are different, and, that is, a size of the clock input transistor of the pull-up module in the $m1^{th}$ GOA unit is greater than a size of the clock input transistor of the pull-up module in the $m2^{th}$ GOA unit.

In an embodiment, as shown in FIG. 6, the clock input transistor includes a plurality of sub-transistors connected in an array, and a number of the sub-transistors of the clock input transistor of the pull-up module in the $m1^{th}$ GOA unit is more than a number of the sub-transistors of the clock input transistor of the pull-up module in the $m2^{th}$ GOA unit. In the actual manufacturing process, each of the transistors is implemented by employing the array of the sub-transistors connected in series, and the more the numbers of the sub-transistors connected in series are used, the larger the resistance of the transistor is. During manufacturing, the embodiment may be achieved only by changing a number of the shading zones of the mask corresponding to the sub-transistors of the clock input transistors in the different GOA units.

In an embodiment, a source area of the clock input transistor of the pull-up module in the $m1^{th}$ GOA unit is greater than a source area of the clock input transistor of the pull-up module in the $m2^{th}$ GOA unit. On the premise that the active layer parameters, the gate parameters, the drain parameters (including the material resistivity, the area, and the thickness), and the certain source parameters (including the material resistivity and the thickness) of one transistor are identical to those of another transistor, the bigger the source area is, the larger the resistance of the transistor is. In the embodiment, the voltage drop value of the transistor is adjusted base on this relation. During manufacturing, the embodiment may be achieved only by changing the area of the shading zone of the mask corresponding to the sources of the clock input transistors in the different GOA units.

In an embodiment, a contact area between the source of the clock input transistor of the pull-up module in the $m1^{th}$ GOA unit and the active layer is less than a contact area between the source of the clock input transistor of the pull-up module in the $m2^{th}$ GOA unit and the active layer. On the premise that the active layer parameters, the gate parameters, the drain parameters (including the material resistivity, the area, and the thickness), and the source parameters (including the material resistivity, the area, and the thickness) of one transistor are identical to those of another transistor, the smaller the contact area between the source and the active layer is, the larger the resistance of the transistor is. In the embodiment, the voltage drop value of the transistor is adjusted base on this relation. During manufacturing, the embodiment may be achieved only by changing an area of a light-transmitting zone of the mask corresponding to connection through holes of the sources of the clock input transistors in the different GOA units.

In an embodiment, a drain area of the clock input transistor of the pull-up module in the $m1^{th}$ GOA unit is greater than a source area of the clock input transistor of the pull-up module in the $m2^{th}$ GOA unit. On the premise that the active layer parameters, the gate parameters, the source parameters (including the material resistivity, the area, and the thickness), and the certain drain parameters (including the material resistivity and the thickness) of one transistor are identical to those of another transistor, the bigger the drain area is, the larger the resistance of the transistor is. In the embodiment, the voltage drop value of the transistor is adjusted base on this relation. During manufacturing, the embodiment may be achieved only by changing the area of the shading zone of the mask corresponding to the drains of the clock input transistors in the different GOA units.

In an embodiment, a contact area between the drain of the clock input transistor of the pull-up module in the m1$^{th}$ GOA unit and the active layer is less than a contact area between the drain of the clock input transistor of the pull-up module in the m2$^{th}$ GOA unit and the active layer. On the premise that the active layer parameters, the gate parameters, the drain parameters (including the material resistivity, the area, and the thickness), and the source parameters (including the material resistivity, the area, and the thickness) of one transistor are identical to those of another transistor, the smaller the contact area between the drain and the active layer is, the larger the resistance of the transistor is. In the embodiment, the voltage drop value of the transistor is adjusted base on this relation. During manufacturing, the embodiment may be achieved only by changing the area of the light-transmitting zone of the mask corresponding to connection through holes of the drains of the clock input transistors in the different GOA units.

In an embodiment, a material resistivity of a source/drain layer of the clock input transistor of the pull-up module in the m1$^{th}$ GOA unit is greater than a material resistivity of a source/drain layer of the clock input transistor of the pull-up module in the m2$^{th}$ GOA unit. On the premise that the active layer parameters, the gate parameters, the certain source parameters (including the area and the thickness), and the certain drain parameters (including the area and the thickness) of one transistor are identical to those of another transistor, the greater the material resistivity of the source/drain layer is, the larger the resistance of the transistor is. In the embodiment, the voltage drop value of the transistor is adjusted base on this relation. During manufacturing, the embodiment may be achieved only by using material with different resistivity, or by changing a material proportion of the material with different resistivity. In an embodiment, the material of the source/drain provided by the present disclosure includes a four-layer structure in order of metal titanium Ti, metal aluminum Al, metal copper Cu, and metal titanium Ti from the bottom to the top. On the basis of ensuring that a total film thickness of the metal aluminum Al and the metal copper Cu in all the transistors is fixed, the change of the material resistivity of the source/drain layer may be achieved by changing the thickness of the metal aluminum Al and the metal copper Cu. Since the resistivity of the copper is less than the resistivity of the aluminum, when the metal layers are deposited, the thick aluminum layer is deposited on the source/drain layer of the clock transistor of the pull-up module in the m1$^{th}$ GOA unit, and the thin aluminum layer is deposited on the source/drain layer of the clock transistor of the pull-up module in the m2$^{th}$ GOA unit, so that the embodiment may be achieved.

In an embodiment, a thickness of the source/drain layer of the clock input transistor of the pull-up module in the m1$^{th}$ GOA unit is less than a thickness of the source/drain layer of the clock input transistor of the pull-up module in the m2$^{th}$ GOA unit. On the premise that the active layer parameters, the gate parameters, the certain source parameters (including the material resistivity and the area), and the certain drain parameters (including material resistivity and the area) of one transistor are identical to those of another transistor, the less the thickness of the material of the source/drain layer is, the larger the resistance of the transistor is. In the embodiment, the voltage drop value of the transistor is adjusted base on this relation. During manufacturing, the embodiment may be obtained by depositing the materials of the source/drain with different thicknesses on different regions.

Figure 7:
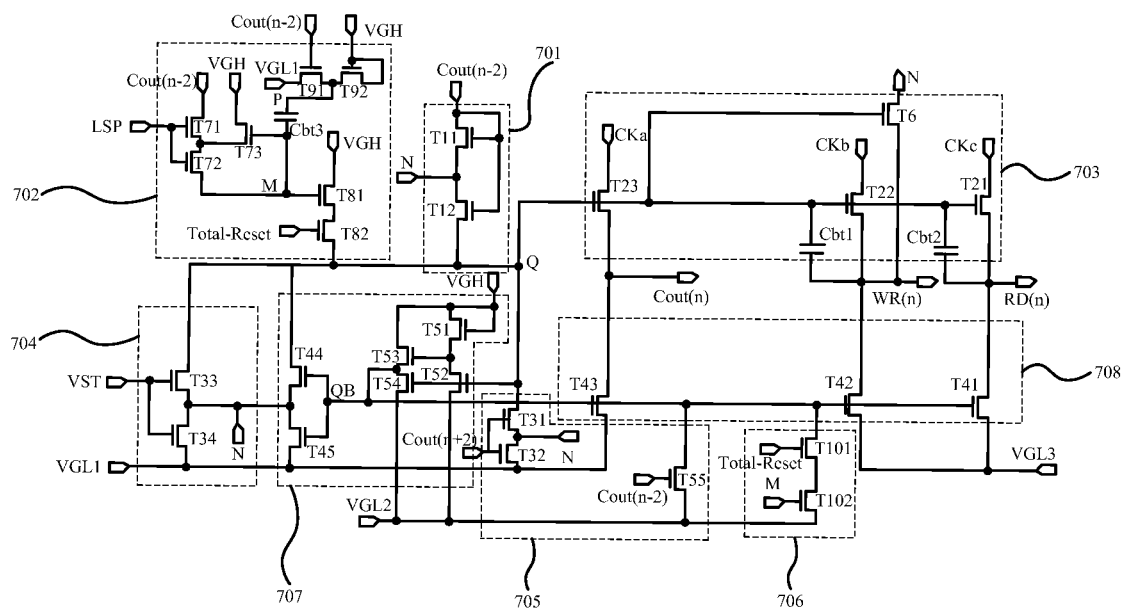
FIG. 7 is a schematic view of a circuit of a gate on array (GOA) circuit provided by embodiments of the present disclosure.

With the increasing of the resolution of the display panel, the signals output by the GOA units require to be compensated in real-time. Therefore, the embodiments of the present disclosure further provide a GOA circuit. The GOA circuit provided by the embodiments of the present disclosure includes m cascaded GOA units. As shown in FIG. 7, the GOA unit includes a pull-up control module 701, a logical address module 702, a pull-up module 703, a first pull-down module 704, a second pull-down module 705, a third pull-down module 706, a first pull-down maintaining module 707, and a second pull-down maintaining module 708.

The pull-up control module 701 is connected with a first node Q and is used to pull up a potential of the first node Q during a display time period.

The logical address module 702 includes a second node M. The logical address module is connected with the first node and is used to pull up a potential of the second node twice during the display time period, and pull up the potential of the first node by the second node during a blank time period.

The pull-up module 703 is connected with the first node Q and is used to pull up potentials of a n$^{th}$ stage transfer signal Cout(n), a first output signal WR(n), and a second output signal RD(n).

The first pull-down module 704 is connected with the first node Q and is used to pull down the potential of the first node Q during the blank time period.

The second pull-down module 705 is connected with the first node Q and a third node QB, and is used to pull down the potential of the first node Q and a potential of the third node QB during the display time period respectively.

The third pull-down module 706 is connected with the third node QB and the second pull-down module 705, and is used to pull down the potential of the third node QB during the blank time period.

The first pull-down maintaining module 707 includes the third node QB, is connected with the first node Q and the first pull-down module 704, and is used to maintain a low potential of the first node Q.

The second pull-down maintaining module 708 is connected with the third node QB and the pull-up module 703, and is used to maintain low potentials of the n$^{th}$ stage transfer signal Cout(n), the first output signal WR(n), and the second output signal RD(n).

The display time period (Programming) and the blank time period (Blank) are elapsed for the display panel to display images. The display time period is an actual display time period of each image, and the blank time period is a time period between the actual time periods of the adjacent images.

In the embodiment shown in FIG. 7, a tenth transistor T23, an eleventh transistor T22, and a twelfth transistor T21 in the pull-up module 703 are the above-mentioned clock input transistor. In the embodiment shown in FIG. 3, the clock driving chip requires to input three clock signals CKa, Ckb, and CKc for the same GOA unit. In this case, each of the clock signal lines is divided into three sub-clock signal lines which are separately used to transmit the CKa, the Ckb, and the CKc, and each of the clock signal connection lines is divided into three sub-clock signal connection lines which separately connect the clock signals CKa, Ckb, and CKc to the corresponding clock input transistors.

In the embodiment, the potential of the second node M is pulled up twice during the display time period to allow a charging rate of the first node Q may be ensured during the blank time period, thereby increasing a threshold voltage margin permitted by the GOA circuit, improving stability of the GOA circuit, and reducing difficulty of developing transistor manufacturing processes.

As shown in FIG. 7, the pull-up control module 701 includes a first transistor T11 and a second transistor T12. A gate and a first electrode of the first transistor T11 as well as a gate of the second transistor T12 are connected with a n-$2^{th}$ stage transfer signal Cout(n-2). A second electrode of the first transistor T11 is connected with a first electrode of the second transistor T12, and a second electrode of the second transistor T12 is connected with the first node Q.

The logical address module 702 includes a third transistor T91, a fourth transistor T92, a fifth transistor T71, a sixth transistor T72, a seventh transistor T73, an eighth transistor T81, a ninth transistor T91m and a first storage capacitor Cbt3. A gate of the third transistor T91 is connected with the n-$2^{th}$ stage transfer signal Cout(n-2), a first electrode of the third transistor T91 is connected with a first low potential signal VGL1, a second electrode of the third transistor T91 is connected with a first electrode of the fourth transistor T92, and a gate and a second electrode of the fourth transistor T92 are connected with a high potential signal VGH. A gate of the fifth transistor T71 is connected with a first input signal LSP, a first electrode of the fifth transistor T71 is connected with the n-$2^{th}$ stage transfer signal Cout (n-2), a second electrode of the fifth transistor T71 is connected with a first electrode of the sixth transistor T72 and a first electrode of the seventh transistor T73, a gate of the sixth transistor T72 is connected with the first input signal, a second electrode of the sixth transistor T72 and a gate of the seventh transistor T73 are connected with the second node M, and a second electrode of the seventh transistor T73 is connected with the high potential signal VGH. A gate of the eighth transistor T81 is connected with the second node M, a first electrode of the eighth transistor T81 is connected with the high potential signal VGH, a second electrode of the eighth transistor T81 is connected with a first electrode of the ninth transistor T91, a gate of the ninth transistor T91 is connected with a reset signal Total-Reset, and a second electrode of the ninth transistor T91 is connected with the first node Q. A first plate of the first storage capacitor Cbt3 is connected with the second electrode of the third transistor T91, and a second plate is connected with the second node M.

The pull-up module 703 includes the tenth transistor T23, the eleventh transistor T22, the twelfth transistor T21, a thirteenth transistor T6, a second storage capacitor Cbt1, and a third storage capacitor Cbt2. A gate of the tenth transistor T23, a gate of the eleventh transistor T22, and a gate of the twelfth transistor T21 are connected with the first node Q, a first electrode of the tenth transistor T23 is connected with the first clock signal CKa, a second electrode of the tenth transistor T23 is connected with the $n^{th}$ stage transfer signal Cout(n), a first electrode of the eleventh transistor T22 is connected with the second clock signal CKb, a second electrode of the eleventh transistor T22 is connected with the first output signal WR(n), a first electrode of the twelfth transistor T21 is connected with the third clock signal CKc, and a second electrode of the twelfth transistor T21 is connected with the second output signal RD(n). A gate of the thirteenth transistor T6 is connected with the first node Q, a first electrode of the thirteen transistor T6 is connected with a fourth node N, and a second electrode of the thirteen transistor T6 is connected with the first output signal WR(n). A first plate of the second storage capacitor Cbt1 is connected with the first node Q, and a second plate is connected with the first output signal WR(n). A first plate of the third storage capacitor Cbt2 is connected with the first node Q, and a second plate is connected with the second output signal RD(n).

The first pull-down module 704 includes a fourteenth transistor T33 and a fifteen transistor T34. A gate of the fourteenth transistor T33 and a gate of the fifteenth transistor T34 are connected with a second input signal VST, a first electrode of the fourteenth transistor T33 is connected with the first node Q, a second electrode of the fourteenth transistor T33 is connected with a first electrode of the fifteen transistor T34 and the fourth node N, and a second electrode of the fifteen transistor T34 is connected with the first low potential signal VGL1.

The second pull-down module 705 includes a sixteenth transistor T31, a seventeenth transistor T32, and an eighteenth transistor T55. A gate of the sixteenth transistor T31 and a gate of the seventeenth transistor T32 are connected with the n+$2^{th}$ stage transfer signal Cout(n+2), a first electrode of the sixteenth transistor T31 is connected with the first node Q, a second electrode of the sixteenth transistor T31 is connected with a first electrode of the seventeenth transistor T32 and the fourth node N, and a second electrode of the seventeenth transistor T32 is connected with the first low potential signal VGL1. A gate of the eighteenth transistor T55 is connected with the n-$2^{th}$ stage transfer signal Cout(n-2), a first electrode of the eighteenth transistor T55 is connected with a second low potential signal VGL2, and a first electrode of the eighteenth transistor T55 is connected with the third node QB.

The third pull-down module 706 includes a nineteenth transistor T102 and a twentieth transistor T101. A gate of the nineteenth transistor T102 is connected with the second node, a first electrode of the nineteenth transistor T102 is connected with the second low potential signal VGL2, a second electrode of the nineteenth transistor T102 is connected with a first electrode of the twentieth transistor T101, a gate of the twentieth transistor T101 is connected with the reset signal Total-Reset, and a second electrode of the twentieth transistor T101 is connected with the third node QB.

The first pull-down maintaining module 707 includes a twenty-first transistor T44, a twenty-second transistor T45, a twenty-third transistor T51, a twenty-fourth transistor T52, a twenty-fifth transistor T53, and twenty-sixth transistor T54. A gate of the twenty-first transistor T44 and a gate of the twenty-second transistor T45 are connected with the third node QB, a first electrode of the twenty-first transistor T44 is connected with the first node Q, a second electrode of the twenty-first transistor T44 is connected with a first electrode of the twenty-second transistor T45 and the fourth node N, and a second electrode of the twenty-second transistor T45 is connected with the first low potential signal VGL1. A gate and a first electrode of the twenty-third transistor T51 are connected with the high potential signal VGH, a second electrode of the twenty-third transistor T51 is connected with a first electrode of the twenty-fourth transistor T52, a gate of the twenty-fourth transistor T52 is connected with the first node Q, and a second electrode of the twenty-fourth transistor T52 is connected with the second low potential signal VGL2. A gate of the twenty-fifth transistor T53 is connected with the second electrode of the twenty-third transistor T51, a first electrode of the twenty-fifth transistor T53 is connected with the high potential signal VGH, a second electrode of the twenty-fifth transistor T53 is connected with a first electrode of the twenty-sixth transistor T54 and the third node QB, a gate of the twenty-sixth transistor T54 is connected with the first node Q, and a second electrode of the twenty-sixth transistor T54 is connected with the second low potential signal VGL2.

The second pull-down maintaining module 708 includes a twenty-seventh transistor T43, a twenty-eighth transistor T42, and a twenty-ninth transistor T41. A gate of the twenty-seventh transistor T43, a gate of the twenty-eighth transistor T42, and a gate of the twenty-ninth transistor T41 are connected with the third node QB. A first electrode of the twenty-seventh transistor T43 is connected with the first low potential signal VGL1, a second electrode of the twenty-seventh transistor T43 is connected with the $n^{th}$ stage transfer signal Cout(n), a first electrode of the twenty-eighth transistor T42 is connected with a third low potential signal VGL3, a second electrode of the twenty-eighth transistor T42 is connected with the first output signal WR(n), a first electrode of the twenty-ninth transistor T41 is connected with the third low potential signal VGL3, and a second electrode of the twenty-ninth transistor T41 is connected with the second output signal RD(n).

The GOA circuit of the present disclosure includes the m cascaded GOA units in which a stage transfer signal output by the $n^{th}$ GOA is the $n^{th}$ stage transfer signal Cout(n), $2 \leq n \leq m$, and n is integral. The $n-2^{th}$ stage transfer signal Cout(n-2) is a stage transfer signal before the $n^{th}$ stage transfer signal Cout(n) and apart from the $n^{th}$ stage transfer signal Cout(n) with one stage, and the $n+2^{th}$ stage transfer signal Cout(n+2) is a stage transfer signal before the $n^{th}$ stage transfer signal Cout(n) and apart from the $n^{th}$ stage transfer signal Cout(n) with one stage.

In the GOA circuit of the present disclosure, the first input signal LSP, the second input signal VST, and the reset signal Total-Reset are provided by an external sequencer.

Figure 8A:
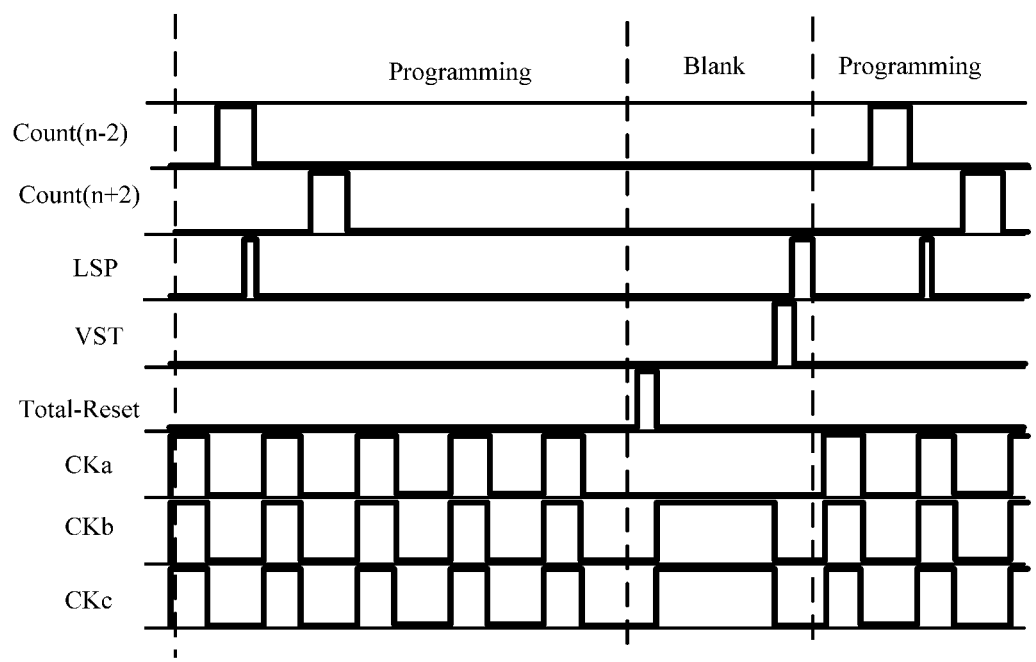
FIGS. 8a to 8c are sequence diagrams of embodiments of the present disclosure.

The GOA circuit provided by the embodiment is a real-time compensated circuit. The GOA is requested to output a normal driving timing display image during the display time period corresponding to each frame, and wide pulse timing that is output during the blank time period between each frame is used to sense a threshold voltage Vth. FIG. 8 shows the timing of individual signals of the GOA circuit during the display time period (Programming) and the blank time period (Blank), wherein voltage setting values of the individual signals at the high potential and the low potential is shown in Table 1.

TABLE 1

| GOA signal | setting voltage | |
| --- | --- | --- |
| | low potential | high potential |
| Cout(n − 2) | −13 | +20 |
| Cout(n + 2) | −13 | +20 |
| LSP | −13 | +20 |
| VST | −13 | +20 |
| Total-Reset | −13 | +20 |
| CKa | −13 | +20 |
| CKb | −13 | +20 |
| CKc | −13 | +20 |
| VGH | | +20 |
| VGL1 | −13 | |
| VGL2 | −10 | |
| VGL3 | −6 | |

The operation of the GOA circuit during the display time period and the blank time period is specifically illustrated in combination with FIG. 8b and FIG. 8c below.

Figure 8B:
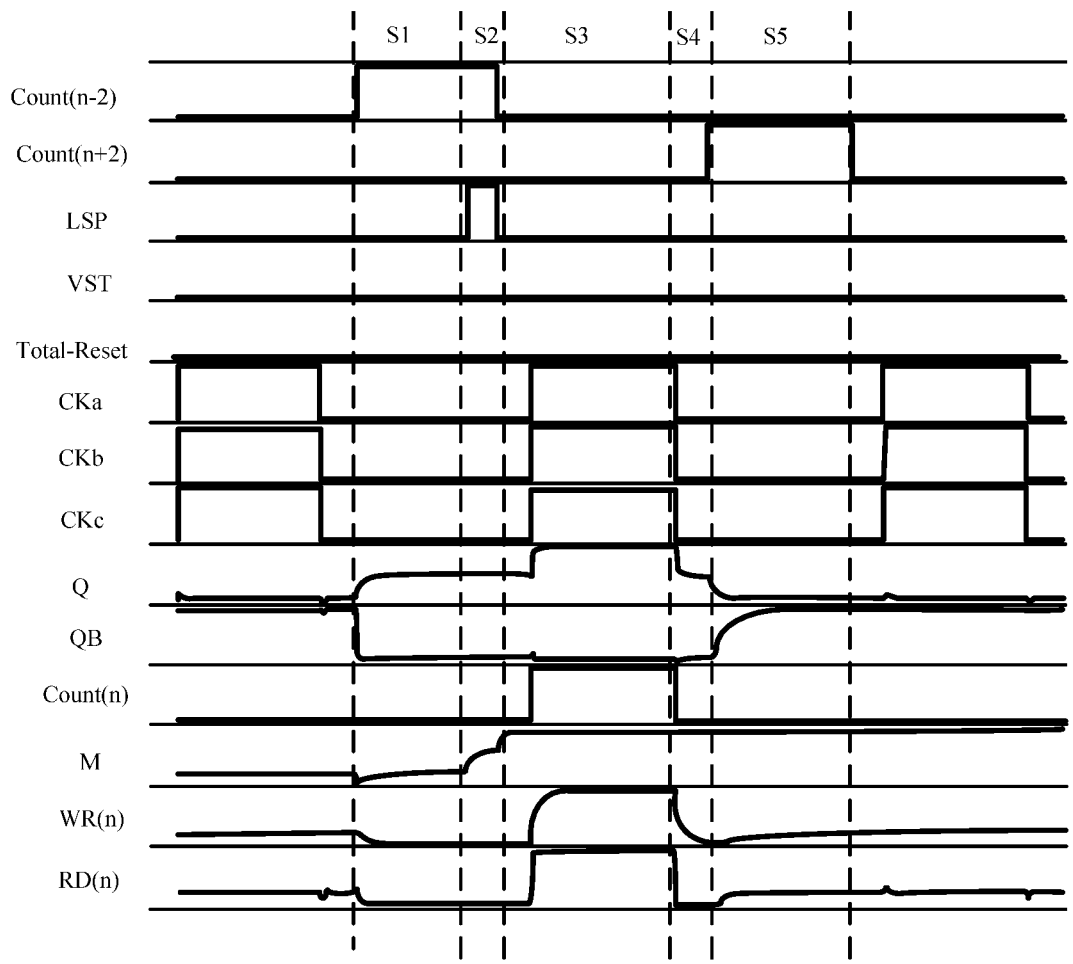

As shown in FIG. 8b, the display time period includes a first display stage S1, a second display stage S2, a third display stage S3, a fourth display stage S4, and a fifth display stage S5.

In the first display stage S1, the $n-2^{th}$ stage transfer signal Cout(n-2) is raised to the high potential, the first transistor T11 and the second transistor T12 are turned on, the first node Q is pulled up to the high potential, and the twenty-fourth transistor T52, the twenty-sixth transistor T54, the tenth transistor T23, the eleventh transistor T22, and the twelfth transistor T21 are turned on. Since the connection between the first node Q and the third node QB constitutes an inverter structure to cause the potential of the first node Q to be opposite to the potential of the third node QB, the third node QB is at the low potential, and the twenty-seventh transistor T43, the twenty-eighth transistor T42, the twenty-ninth transistor T41, the twenty-first transistor T44, and the twenty-second T45 are turned off. At the same time, the $n+2^{th}$ stage transfer signal Cout(n+2) is at the low potential, the sixteenth transistor T31 and the seventeenth transistor T32 are turned off, the second input signal VST is at the low potential, and the fourteenth transistor T33 and the fifteenth transistor T34 are turned off. The first timing signal CKa, the second timing signal CKb, and the third timing signal CKc are at the low potential, and the $n^{th}$ stage transfer signal Cout(n), the first output signal WR(n), and the second output signal RD(n) output the low potential. Since the $n-2^{th}$ stage transfer signal Cout(n-2) is at the high potential, the third transistor T91 is turned on, a point P which is connected with the first plate of the first storage capacitor Cbt3 is reset to the low potential, and the second node M which is connected with the second plate is at the low potential at the same time.

In the second display stage S2, the first input signal LSP is raised to the high potential. At this time, the $n-2^{th}$ stage transfer signal Cout(n-2) is maintained at the high potential, the second node M is pull up to the high potential, the fourth transistor T92 is turned on, and the point P is maintained at the low potential. Since the signals, such as the reset signal Total-Reset and thee second input signal VST, are at the low potential, the first node Q is maintained at the high potential, and the third node QB is maintained at the low potential.

In the third display stage S3, the potential of the first input signal LSP is declined from the high potential to the low potential, the fifth transistor T71 and the sixth transistor T72 are turned off, and the potential of the $n-2^{th}$ stage transfer signal Cout(n-2) is changed from the high potential to the low potential, so the third transistor T91 is turned off, and the potential of the point P is changed from the low potential to the high potential. Since the first storage capacitor Cbt3 exists, the second node M is subjected to a coupling effect to be raised to a higher potential. Since the potentials of the first timing signal Cka, the second timing signal Ckb, and the third timing signal Ckc are changed from the low potential to the high potential, the potentials of the $n^{th}$ stage transfer signal Cout(n), the first output signal WR(n), and the second output signal RD(n) are raised to the high potential. At the same time, since the second storage capacitor Cbt1 and the third storage capacitor Cbt2 exist, the first node Q is coupled to a higher potential.

In the fourth display stage S4, the potentials of the first timing signal Cka, the second timing signal Ckb, the third timing signal CKc are changed from the high potential to the low potential, the potentials of the $n^{th}$ stage transfer signal Cout(n), the first output signal WR(n), and the second output signal RD(n) are pulled down to the low potential, and the signal of the first node Q is coupled to be declined and is consistent to the potential in the second display stage S2.

In the fifth display stage S5, the potential of the $n+2^{th}$ stage transfer signal Cout(n+2) is raised from the low potential to the high potential, the sixteenth transistor T31 and the seventeenth transistor T32 are turned on, the potential of the first node Q is pulled down to the low potential, the twenty-fourth transistor T52, the twenty-sixth transistor T54, the tenth transistor T23, the eleventh transistor T22, and the twelfth transistor T21 are turned off, the potential of the third node QB is raised to the high potential, the twenty-seventh transistor T43, the twenty-eighth transistor T42, the twenty-ninth transistor T41, the twenty-first transistor T44, and the twenty-second transistor T45 are turned on, and the first node Q, the $n^{th}$ stage transfer signal Cout(n), the first output signal WR(n), and the second output signal RD(n) are maintained at the low potential.

Figure 8C:
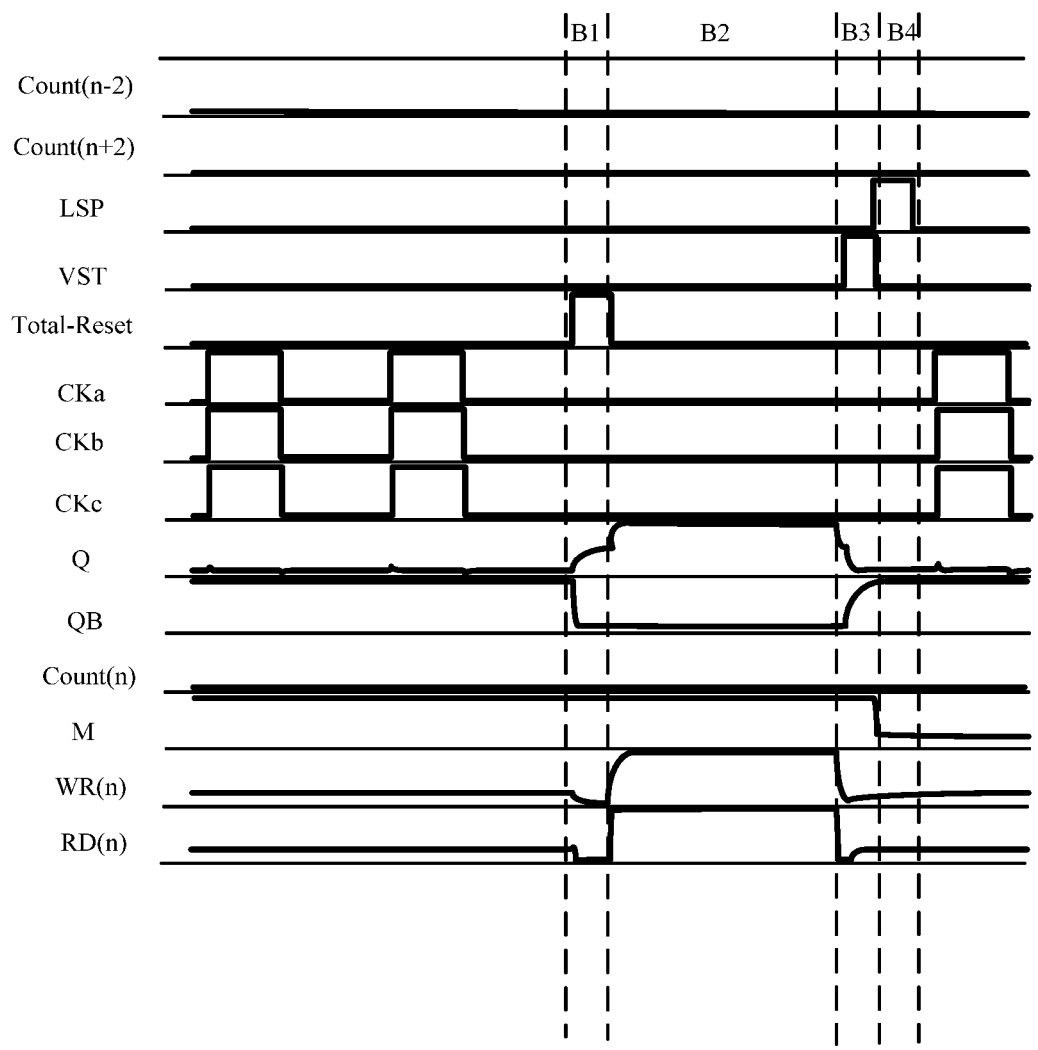

As shown in FIG. 8c, the blank time period includes a first blank stage B1, a second blank stage B2, a third blank stage B3, and a fourth blank stage B4.

In the first blank stage B1, the reset signal Total reset is raised to the high potential, the ninth transistor T82 is turned on, the potential of the first node Q is pulled up to the high potential, the twenty-fourth transistor T52, the twenty-sixth transistor T54, the tenth transistor T23, the eleventh transistor T22, and the twelfth transistor T21 are turned on. Since the connection between the first node Q and the third node QB constitutes the inverter structure to cause the potential of the first node Q to be opposite to the potential of the third node QB, the potential of the third node QB is at the low potential, and the twenty-seventh transistor T43, the twenty-eighth transistor T42, the twenty-ninth transistor T41, the twenty-first transistor T44, and the twenty-second transistor T45 are turned off. At the same time, the $n+2^{th}$ stage transfer signal Cout(n+2) is at the low potential, the sixteenth transistor T31 and the seventeenth transistor T32 are turned off, the second input signal VST is at the low potential, and the fourteenth transistor T33 and the fifteenth transistor T34 are turned off. The first timing signal CKa, the second timing signal CKb, and the third timing signal CKc are at the low potential, and the $n^{th}$ stage transfer signal Cout(n), the first output signal WR(n), and the second output signal RD(n) output the low potential.

In the second blank stage B2, the reset signal Total reset is declined to the low potential, the ninth transistor T82 is turned off, the first timing signal CKa is maintained at the low potential, the second timing signal CKb and the third timing signal CKc are raised to the high potential, the $n^{th}$ stage transfer signal Cout(n) is maintained at the low potential, and the first output signal WR(n) and the second output signal RD(n) output the high potential. The first node Q is coupled to a higher potential.

In the third blank stage B3, the potential of the second input signal VST is raised from the low potential to the high potential, the fourteenth transistor T33 and the fifteenth transistor T34 are turned on, the potential of the first node Q is pull down to the low potential, the twenty-fourth transistor T52, the twenty-sixth transistor T54, the tenth transistor T23, the eleventh transistor T22, and the twelfth transistor T21 are turned off, the potential of the third node QB is raised to the high potential, the twenty-seventh transistor T43, the twenty-eighth transistor T42, the twenty-ninth transistor T41, the twenty-first transistor T44, and the twenty-second transistor T45 are turned on, the first node Q, the first output signal WR(n), and the second output signal RD(n) are pull down to the low potential, and the $n^{th}$ stage transfer signal Cout(n) is maintained at the low potential.

In the fourth blank stage B4, the first input signal LSP is raised to the high potential, and the fifth transistor T71 and the sixth transistor T72 are turned on. Since the $n-2^{th}$ stage transfer signal Cout(n-2) is the low potential, the second node M is reset to the low potential, and the eighth transistor T81 is turned off. The first node Q, the $n^{th}$ stage transfer signal Cout(n), the first output signal WR(n), and the second output signal RD(n) are maintained at low potential.

The GOA circuit provided by the embodiment of the present disclosure is a real-time compensated circuit. By the above-mentioned processes, the driving signals are provided for the scan lines to make the display panel to display the images.

In the above-mentioned processes, by disposing the third transistor T91 and the fourth transistor T92 on the first plate of the first storage capacitor Cbt3, in the first display stage S1, the third transistor T91 and the fourth transistor T92 are turned on, so that the potentials of the point P and the second node M are the low potential; in the second display stage S2, the third transistor T91 and the fourth transistor T92 are turned on, the potential of the point P is maintained at the low potential, and the potential of the second node M is pulled up for the first time; in the third display stage S3, the third transistor T91 is turned off, the fourth transistor T92 is turned on, the potential of the point P is pulled up, and the potential of the second node M is pulled up for the second time due to the coupling effect. Therefore, in the first blank stage B1, compared to the prior art, the potential of the first node Q is pulled to a higher level, so that the charging rate is ensured, thereby increasing the threshold voltage margin permitted by the GOA circuit, improving the stability of the GOA circuit, and reducing the difficulty of developing the transistor manufacturing processes.

In an embodiment, for the technical problem that the photo spacer easily peels, taking the display panel with a POA (PS on Array, PS is on the array substrate) as an example, as shown in FIG. 5, in the region contacting with the photo spacer 54, a convex-concave pattern 55 is formed on a contact film layer 511 of the array substrate 51 contacting with the photo spacer 54. The convex-concave pattern 55 is used to increase the contact area between the contact film layer 511 and the photo spacer 54.

In an embodiment, the convex-concave pattern includes a target pattern formed by at least one of protrusion, depression, or a combination of protrusion and depression of the contact film layer. For example, in the following embodiment, the target pattern is formed on the contact film layer in a manner of the depression. In other embodiments, the contact film layer may form the target pattern by at least one of the protrusion or the combination of protrusion and depression. The combination of protrusion and depression means that the contact film layer forms a part of the target pattern by the protrusion and forms other parts of the target pattern by the depression.

The display panel provided by the embodiment increases the contact area between the photo spacer and the bottom layer without changing the size of the single sub-pixel, thus ameliorating the technical problem that the photo spacer existing in the electronic equipment with the 8K ultra-high resolution easily peels.

Figure 9:
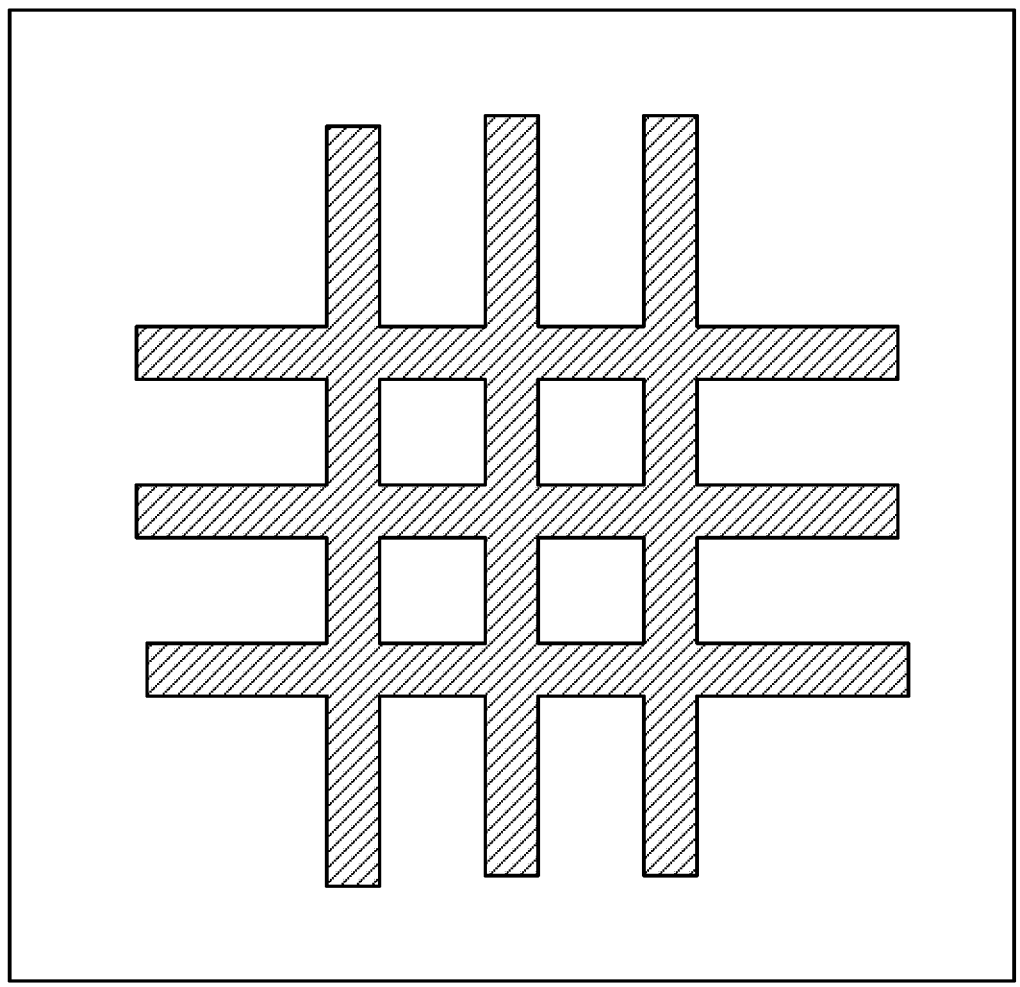
FIG. 9 is a schematic view of a design of a target pattern provided by embodiments of the present disclosure.

In an embodiment, as shown in FIG. 9, the shape of the target pattern corresponding to the convex-concave pattern 55 provided by the embodiment of the present application is a grid. In some embodiment, a size of the grid is 1 to 6 μm, a spacing is 1 to 6 μm, and a depth is less than 0.5 μm. The embodiment may be achieved by performing the photolithography process to the contact film layer (an organic material layer in general) through the mask. For example, for the disposition region of the convex-concave pattern, by changing a grid design of the RGB/PFA mask at such a region, the mask with 80% to 90% transmittance is used to decrease the transmittance, and a part of the photoresist is removed by a developing solution, thus achieving the requirement of forming the convex-concave pattern when the film thickness is reduced by 0.5 μm.

In an embodiment, the driving circuit is formed in a range of the third side region D3, and the convex-concave pattern is formed in the range of the third side region D3. For example, the convex-concave pattern is formed in the third side region D3. Correspondingly, in the third side region C3, the mask forms a shading pattern corresponding to the target pattern of the convex-concave pattern, and the light transmittance of the shading pattern is 80% to 90%, thus realizing that the depressed target pattern is formed as the convex-concave pattern in a region corresponding to the black matrices.

In an embodiment, when the display panel is a color filter on array (COA, the RGB is on the array substrate) structure and is not a PS on array (POA, the PS is on the array substrate) structure, the photo spacers are formed on the color filter substrate, the color filter substrate includes the base substrate and the black matrices formed on the base substrate, and the black matrices surround the openings arranged in an array and corresponding the light-emitting zones of the sub-pixels. The photo spacers are formed on the black matrices, and, that is, the black matrix is the above-mentioned contact film layer, and the convex-concave pattern is formed in a region of the black matrix contacting with the photo spacer.

In an embodiment, when the display panel is not the color filter on array (COA, the RGB is on the array substrate) structure and is not the PS on Array (POA, the PS is on the array substrate) structure, the photo spacers are formed on the color filter substrate, the color filter substrate includes the base substrate, the black matrices formed on the base substrate, and the color filter layers, and the black matrices surround the color filter layers arranged in an array and corresponding the light-emitting zones of the sub-pixels. The photo spacers are formed on the black matrices, and, that is, the black matrix is the above-mentioned contact film layer, and the convex-concave pattern is formed in the region of the black matrix contacting with the photo spacer.

In an embodiment, when the display panel is not the color filter on array (COA, the RGB is on the array substrate) structure and is not the PS on Array (POA, the PS is on the array substrate) structure, the photo spacers are formed on the color filter substrate, and the color filter substrate includes the base substrate, the black matrices formed on the base substrate, and the color filter layers formed on the black matrices. The photo spacers are formed on the color filter layers and are located in regions where the color filter layers overlap with the black matrices, and, that is, the color filter is the above-mentioned contact film layer, and the convex-concave pattern is formed in a region of the color filter layer contacting with the photo spacer.

In an embodiment, when the display panel is not the color filter on array (COA, the RGB is on the array substrate) structure and is not the PS on Array (POA, the PS is on the array substrate) structure, the photo spacers are formed on the color filter substrate, and the color filter substrate includes the base substrate, the black matrices formed on the base substrate, and the color filter layers formed on the black matrices. The photo spacers are formed on the color filter layers and are located in the regions where the color filter layers overlap with the black matrices, and, that is, the color filter layer is the above-mentioned contact film layer, the convex-concave pattern is formed in the region of the color filter layer contacting with the photo spacer, and the black matrix is also provided with the convex-concave pattern in the region of the color filter layer contacting with the photo spacer.

In an embodiment, when the display panel is not the color filter on array (COA, the RGB is on the array substrate) structure and is the PS on Array (POA, the PS is on the array substrate) structure, the photo spacers are formed on the array substrate, and the array substrate includes the base substrate, the driving circuit layer formed on the base substrate, and the planarization layer formed on the driving circuit layer. The photo spacers are formed on the planarization layer, and, that is, the planarization layer is the above-mentioned contact film layer, and the convex-concave pattern is formed in a region of the planarization layer contacting with the photo spacer.

In an embodiment, when the display panel is the color filter on array (COA, the RGB is on the array substrate) structure and is the PS on Array (POA, the PS is on the array substrate) structure, the photo spacers are formed on the array substrate, and the array substrate includes the base substrate, the driving circuit layer formed on the base substrate, the color resist layer formed on the driving circuit layer, and the planarization layer formed on the color resist layer. The photo spacers are formed on the planarization layer, and, that is, the planarization layer is the above-mentioned contact film layer, and the convex-concave pattern is formed in the region of the planarization layer contacting with the photo spacer.

In an embodiment, when the display panel is the color filter on array (COA, the RGB is on the array substrate) structure and is the PS on Array (POA, the PS is on the array substrate) structure, the photo spacers are formed on the array substrate, and the array substrate includes the base substrate, the driving circuit layer formed on the base substrate, the color resist layer formed on the driving circuit layer, and the planarization layer formed on the color resist layer (RGB layer). The photo spacers are formed on the planarization layer, and, that is, the planarization layer is the above-mentioned contact film layer, the convex-concave pattern is formed in the region of the planarization layer contacting with the photo spacer, and the color resist layer is also provided with the convex-concave pattern in the region of the planarization layer contacting with the photo spacer.

In an embodiment, material of the planarization layer is PFA (macromolecular organic transparent material), a thickness of the planarization layer is about 1.5 μm, and thicknesses of the black matrix, the color filter layer, and the color resist layer are 2 to 3 μm. Based on those thicknesses, original functions of the film layers do not be affected after the convex-concave pattern is formed.

In an embodiment, the photo spacer includes a main photo spacer (Main ps) and a sub-photo spacer (Sub ps). Regions of the contact film layer contacting with the main photo spacer and the sub-photo spacer may form the convex-concave patterns with the same parameters (including size, shape, depth, and the like), or may also form the convex-concave patterns with the different parameters (including size, shape, depth, and the like). For example, a depth of the convex-concave pattern 15 formed on the contact film layer contacting with the main photo spacer is greater than a depth of the convex-concave pattern formed on the contact film layer contacting with the sub-photo spacer.

The present disclosure further provides an electronic equipment including the display panel provided by any one of the above embodiments.

In an embodiment, the electronic equipment includes a display panel including a color filter substrate and an array substrate that are oppositely disposed, and the color filter substrate includes:

a base substrate;

a plurality of black matrices formed on the base substrate and including openings for filling with color filter layers; and a plurality of color filter layers formed within the openings;

wherein the color filter substrate includes a plurality of pixel regions arranged in an array and corresponding to sub-pixels; the pixel region includes a first region corresponding to the opening as well as a second region surrounding the first region, and the black matrix is formed on the second region; the second region includes a first side region and a second side region which are arranged in a row direction and parallel to each other as well as a third side region and a fourth side region which are arranged in a column direction and parallel to each other; and a fifth distance from a side of the first side region away from the opening to the opening is less than a sixth distance from a side of the second side region away from the opening to the opening.

In an embodiment, the electronic equipment includes the display panel, and the display panel includes:

m GOA units arranged in the column direction, wherein the GOA unit includes a pull-up module which includes a clock input transistor connected with a clock signal;

n clock signal lines extending in the column direction and arranged in parallel; and m clock signal connection lines extending in the row direction and arranged in parallel, wherein the clock signal connection lines correspond to the GOA units one by one, and are used to connect the clock input transistor of the pull-up module in the GOA unit to the corresponding clock signal line;

wherein the n clock signal lines include a $n1^{th}$ clock signal line and a $n2^{th}$ clock signal line; the $n2^{th}$ clock signal line is formed on a side of the $n1^{th}$ clock signal line away from the GOA units; and a voltage drop value of the clock input transistor of the pull-up module in a $m1^{th}$ GOA unit connected with the $n1^{th}$ clock signal line is greater than a voltage drop value of the clock input transistor of the pull-up module in a $m2^{th}$ GOA unit connected with the $n2^{th}$ clock signal line.

In an embodiment, in the electronic equipment of the present disclosure, a size of the clock input transistor of the pull-up module in the $m1^{th}$ GOA unit is greater than a size of the clock input transistor of the pull-up module in the $m2^{th}$ GOA unit.

In an embodiment, in the electronic equipment of the present disclosure, the clock input transistor includes a plurality of sub-transistors connected in an array, and a number of the sub-transistors of the clock input transistor of the pull-up module in the $m1^{th}$ GOA unit is more than a number of the sub-transistors of the clock input transistor of the pull-up module in the $m2^{th}$ GOA unit.

In an embodiment, in the electronic equipment of the present disclosure, a source area of the clock input transistor of the pull-up module in the m1th GOA unit is greater than a source area of the clock input transistor of the pull-up module in the $m2^{th}$ GOA unit, and/or a drain area of the clock input transistor of the pull-up module in the $m1^{th}$ GOA unit is greater than a drain area of the clock input transistor of the pull-up module in the $m2^{th}$ GOA unit.

In an embodiment, in the electronic equipment of the present disclosure, a contact area between a source of the clock input transistor of the pull-up module in the $m1^{th}$ GOA unit and an active layer is less than a contact area between a source of the clock input transistor of the pull-up module in the $m2^{th}$ GOA unit and the active layer.

In an embodiment, in the electronic equipment of the present disclosure, a $n^{th}$ GOA unit includes:

a pull-up control module connected with a first node and used to pull up a potential of the first node during a display time period;

a logical address module including a second node and connected with the first node, wherein the logical address module is used to pull up a potential of the second node twice during the display time period, and pull up the potential of the first node by the second node during a blank time period;

the pull-up module connected with the first node and used to pull up potentials of a $n^{th}$ stage transfer signal, a first output signal, and a second output signal;

a first pull-down module connected with the first node and used to pull down the potential of the first node during the blank time period;

a second pull-down module connected with the first node and a third node, and used to pull down the potential of the first node and a potential of the third node during the display time period;

a third pull-down module connected with the third node and the second pull-down module, and used to pull down the potential of the third node during the blank time period;

a first pull-down maintaining module including the third node, connected with the first node and the first pull-down module, and used to maintain a low potential of the first node; and a second pull-down maintaining module connected with the third node and the pull-up module, and used to maintain low potentials of the $n^{th}$ stage transfer signal, the first output signal, and the second output signal.

In an embodiment, in the electronic equipment of the present disclosure, the pull-up control module includes a first transistor and a second transistor, a gate and a first electrode of the first transistor as well as a gate of the second transistor are connected with a $n-2^{th}$ stage transfer signal, a second electrode of the first transistor is connected with a first electrode and a fourth node of the second transistor, and a second electrode of the second transistor is connected with the first node.

In an embodiment, in the electronic equipment of the present disclosure, a material resistivity of a source/drain layer of the clock input transistor of the pull-up module in the $m1^{th}$ GOA unit is greater than a material resistivity of a source/drain layer of the clock input transistor of the pull-up module in the $m2^{th}$ GOA unit.

In an embodiment, in the electronic equipment of the present disclosure, a thickness of a source/drain layer of the clock input transistor of the pull-up module in the $m1^{th}$ GOA unit is less than a thickness of a source/drain layer of the clock input transistor of the pull-up module in the $m2^{th}$ GOA unit.

In an embodiment, in the electronic equipment of the present disclosure, a contact area between a drain of the clock input transistor of the pull-up module in the $m1^{th}$ GOA unit and an active layer is less than a contact area between a drain of the clock input transistor of the pull-up module in the $m2^{th}$ GOA unit and the active layer.

It can be known according to the above embodiments that:

The present disclosure provides a mask, a display panel, and an electronic equipment. The mask includes the mask substrate and the opening pattern formed on the mask substrate and used to form the black matrix or the color filter layer of the color filter substrate, and the black matrix includes the opening for filling with the color filter layer. The mask includes a plurality of the repeat regions, and the repeat region includes the first region corresponding to the opening pattern and the second region surrounding the first region. The second region includes the first side region and the second side region which are arranged in the row direction and parallel to each other as well as the third side region and the fourth side region which are arranged in the column direction and parallel to each other. The first distance from the side of the first side region away from the opening pattern to the opening pattern is less than the second distance from the side of the second side region away from the opening pattern to the opening pattern. This mask does not employ the opening patterns of the conventional masks, such as the design that the shading zone corresponds to the center of the repeat region, and moves the opening pattern to the side, so that the black matrix opening or the color filter layer with the target size can be obtained based on the diffraction effect, and the size of the opening pattern does not require to be changed. Based on this structure, the display panels with the same resolution and the different sizes may use the masks with the same size, and the differences between these masks are merely the different distances between the opening patterns and the edges of the repeat regions, thus solving at least one technical problem existing in the conventional 8K electronic equipment that the masks with the different sizes require to be manufactured for the display panels with the different sizes, and decreasing the manufacturing costs of the products.

The above context introduces a mask, a display panel, and an electronic equipment provided by the embodiments of the present disclosure in detail. Specific examples herein are used to explain the principles and the implementation of the present disclosure. The illustration of the foregoing embodiments is only used to facilitate understanding the technical solutions and the core ideas of the present disclosure. Those skilled in the art should understand that: the technical solutions described in the foregoing embodiments can still be modified, or some of the technical features can be equivalently replaced, and these modifications or replacements do not make the essence of the corresponding technical solutions depart from the scope of the technical solutions of various embodiments of the present disclosure.

What is claimed is:

1. A mask for manufacturing a color filter substrate, comprising:
    a mask substrate; and
    an opening pattern formed on the mask substrate;
    wherein the mask includes a plurality of repeat regions, and the repeat region includes a first region corresponding to the opening pattern and a second region surrounding the first region; the second region includes a first side region and a second side region which are arranged in a row direction and parallel to each other as well as a third side region and a fourth side region which are arranged in a column direction and parallel to each other; and a first distance from a side of the first side region away from the opening pattern to the opening pattern is less than a second distance from a side of the second side region away from the opening pattern to the opening pattern.

2. The mask according to claim 1, wherein a third distance from a side of the third side region away from the opening pattern to the opening pattern is equal to a fourth distance from a side of the fourth side region away from the opening pattern to the opening pattern.

3. The mask according to claim 1, wherein the first distance is less than 12 μm, and the second distance is greater than 32 μm.

4. The mask according to claim 1, wherein the first distance is less than 10 μm, and the second distance is greater than 34 μm.

5. The mask according to claim 1, wherein a width of the opening pattern in the row direction is 28 μm.

6. The mask according to claim 5, wherein a sum of the first distance and the second distance is 44 μm.

7. A display panel comprising a color filter substrate and an array substrate that are oppositely disposed, wherein the color filter substrate includes:
    a base substrate;
    a plurality of black matrices formed on the base substrate and including openings for filling with color filter layers; and
    a plurality of color filter layers formed within the openings;
    wherein the color filter substrate includes a plurality of pixel regions arranged in an array and corresponding to sub-pixels; the pixel region includes a first region corresponding to the opening as well as a second region surrounding the first region, and the black matrix is formed on the second region; the second region includes a first side region and a second side region which are arranged in a row direction and parallel to each other as well as a third side region and a fourth side region which are arranged in a column direction and parallel to each other; and a fifth distance from a side of the first side region away from the opening to the opening is less than a sixth distance from a side of the second side region away from the opening to the opening.

8. The display panel according to claim 7, wherein in the row direction, the fifth distance is less than 18 μm, and the sixth distance is greater than 18 μm.

9. The display panel according to claim 7, wherein a width of the openings is 16 μm, and a sum of the fifth distance and the sixth distance is 56 μm.

10. An electronic equipment comprising a display panel including a color filter substrate and an array substrate that are oppositely disposed, wherein the color filter substrate includes:
    a base substrate;
    a plurality of black matrices formed on the base substrate and including openings for filling with color filter layers; and
    a plurality of color filter layers formed within the openings;
    wherein the color filter substrate includes a plurality of pixel regions arranged in an array and corresponding to sub-pixels; the pixel region includes a first region corresponding to the opening as well as a second region surrounding the first region, and the black matrix is formed on the second region; the second region includes a first side region and a second side region which are arranged in a row direction and parallel to each other as well as a third side region and a fourth side region which are arranged in a column direction and parallel to each other; and a fifth distance from a side of the first side region away from the opening to the opening is less than a sixth distance from a side of the second side region away from the opening to the opening.

11. The electronic equipment according to claim 10, wherein the display panel includes:
- m gate on array (GOA) units arranged in the column direction, wherein the GOA unit includes a pull-up module which includes a clock input transistor connected with a clock signal;
- n clock signal lines extending in the column direction and arranged in parallel; and
- m clock signal connection lines extending in the row direction and arranged in parallel, wherein the clock signal connection lines correspond to the GOA units one by one, and are used to connect the clock input transistor of the pull-up module in the GOA unit to the corresponding clock signal line;
- wherein the n clock signal lines include a $n1^{th}$ clock signal line and a $n2^{th}$ clock signal line; the $n2^{th}$ clock signal line is formed on a side of the $n1^{th}$ clock signal line away from the GOA units; and a voltage drop value of the clock input transistor of the pull-up module in a $m1^{th}$ GOA unit connected with the $n1^{th}$ clock signal line is greater than a voltage drop value of the clock input transistor of the pull-up module in a $m2^{th}$ GOA unit connected with the $n2^{th}$ clock signal line.

12. The electronic equipment according to claim 11, wherein a size of the clock input transistor of the pull-up module in the $m1^{th}$ GOA unit is greater than a size of the clock input transistor of the pull-up module in the $m2^{th}$ GOA unit.

13. The electronic equipment according to claim 12, wherein the clock input transistor includes a plurality of sub-transistors connected in an array, and a number of the sub-transistors of the clock input transistor of the pull-up module in the $m1^{th}$ GOA unit is more than a number of the sub-transistors of the clock input transistor of the pull-up module in the $m2^{th}$ GOA unit.

14. The electronic equipment according to claim 12, wherein a source area of the clock input transistor of the pull-up module in the $m1^{th}$ GOA unit is greater than a source area of the clock input transistor of the pull-up module in the $m2^{th}$ GOA unit, and/or a drain area of the clock input transistor of the pull-up module in the $m1^{th}$ GOA unit is greater than a drain area of the clock input transistor of the pull-up module in the $m2^{th}$ GOA unit.

15. The electronic equipment according to claim 12, wherein a contact area between a source of the clock input transistor of the pull-up module in the $m1^{th}$ GOA unit and an active layer is less than a contact area between a source of the clock input transistor of the pull-up module in the $m2^{th}$ GOA unit and the active layer.

16. The electronic equipment according to claim 11, wherein a $n^{th}$ GOA unit includes:
- a pull-up control module connected with a first node and used to pull up a potential of the first node during a display time period;
- a logical address module including a second node and connected with the first node, wherein the logical address module is used to pull up a potential of the second node twice during the display time period, and pull up the potential of the first node by the second node during a blank time period;
- the pull-up module connected with the first node and used to pull up potentials of a $n^{th}$ stage transfer signal, a first output signal, and a second output signal;
- a first pull-down module connected with the first node and used to pull down the potential of the first node during the blank time period;
- a second pull-down module connected with the first node and a third node, and used to pull down the potential of the first node and a potential of the third node during the display time period;
- a third pull-down module connected with the third node and the second pull-down module, and used to pull down the potential of the third node during the blank time period;
- a first pull-down maintaining module including the third node, connected with the first node and the first pull-down module, and used to maintain a low potential of the first node; and
- a second pull-down maintaining module connected with the third node and the pull-up module, and used to maintain low potentials of the $n^{th}$ stage transfer signal, the first output signal, and the second output signal.

17. The electronic equipment according to claim 16, wherein the pull-up control module includes a first transistor and a second transistor, a gate and a first electrode of the first transistor as well as a gate of the second transistor are connected with a $n-2^{th}$ stage transfer signal, a second electrode of the first transistor is connected with a first electrode and a fourth node of the second transistor, and a second electrode of the second transistor is connected with the first node.

18. The electronic equipment according to claim 11, wherein a material resistivity of a source/drain layer of the clock input transistor of the pull-up module in the $m1^{th}$ GOA unit is greater than a material resistivity of a source/drain layer of the clock input transistor of the pull-up module in the $m2^{th}$ GOA unit.

19. The electronic equipment according to claim 11, wherein a thickness of a source/drain layer of the clock input transistor of the pull-up module in the $m1^{th}$ GOA unit is less than a thickness of a source/drain layer of the clock input transistor of the pull-up module in the $m2^{th}$ GOA unit.

20. The electronic equipment according to claim 12, wherein a contact area between a drain of the clock input transistor of the pull-up module in the $m1^{th}$ GOA unit and an active layer is less than a contact area between a drain of the clock input transistor of the pull-up module in the $m2^{th}$ GOA unit and the active layer.

* * * * *